(12) United States Patent
Tai et al.

(10) Patent No.: US 11,077,462 B2
(45) Date of Patent: Aug. 3, 2021

(54) RELIABLE DEPOSITION OF THIN PARYLENE

(71) Applicant: California Institute of Technology, Pasadena, CA (US)

(72) Inventors: Yu-Chong Tai, Pasadena, CA (US); Wei Wang, Beijing (CN); Dongyang Kang, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 716 days.

(21) Appl. No.: 15/331,544

(22) Filed: Oct. 21, 2016

(65) Prior Publication Data
US 2017/0113246 A1 Apr. 27, 2017

Related U.S. Application Data

(60) Provisional application No. 62/245,421, filed on Oct. 23, 2015.

(51) Int. Cl.
*B05D 1/00* (2006.01)
*B05D 3/04* (2006.01)
(Continued)

(52) U.S. Cl.
CPC ............. *B05D 1/60* (2013.01); *B05D 3/0486* (2013.01); *B05D 3/0493* (2013.01); *B81C 1/00674* (2013.01); *C23C 16/45559* (2013.01)

(58) Field of Classification Search
CPC ... B05D 1/60; C23C 16/4485; C23C 16/4401; C23C 16/45517; C23C 16/4411;
(Continued)

(56) References Cited

U.S. PATENT DOCUMENTS 1,543,506 A * 6/1925 Miller .................... B29C 65/74
264/159
3,515,095 A * 6/1970 Baranow ................. C23C 10/48
118/717
(Continued)

FOREIGN PATENT DOCUMENTS

CN 101616640 12/2009
WO 2008083118 7/2008
(Continued)

OTHER PUBLICATIONS

Arai et al., "Long-Term Electroencephalogram Measurement Using Polymer-Based Dry Microneedle Electrode", IEEE, Transducers 2015, Anchorage, Alaska, Jun. 21-25, 2015, pp. 81-84.
(Continued)

*Primary Examiner* — Aiden Lee
(74) *Attorney, Agent, or Firm* — Kilpatrick Townsend & Stockton LLP

(57) ABSTRACT

Apparatus, system, and method of depositing thin and ultra-thin parylene are described. In an example, a core deposition chamber is used. The core deposition chamber includes a base and a rigid, removable cover configured to mate and seal with the base to create the core deposition chamber and to define an inside and an outside of the core deposition chamber. The core deposition chamber also includes a conduit through a top of the cover. The conduit has a lumen connecting the inside to the outside of the core deposition chamber. The lumen has a length and a cross-section. The cross-section has a width between 50 μm and 6000 μm. The length is less than 140 times the cross-section width. The core deposition chamber can be placed in an outer deposition chamber and can achieve parylene deposition less than 1 μm thick inside the core deposition chamber.

20 Claims, 13 Drawing Sheets

(51) Int. Cl.
*B81C 1/00* (2006.01)
*C23C 16/455* (2006.01)
(58) Field of Classification Search
CPC .............. C23C 16/4586; C23C 16/46; C23C
14/24–325; H01L 21/67115; H01L
21/67754; H01L 21/67742; H01L
21/68764; H01L 1/67109; H01L 21/6719;
H01L 21/68707; H01L 21/68771
See application file for complete search history.

(56) References Cited

U.S. PATENT DOCUMENTS

| | | | |
|---|---|---|---|
| 4,572,846 A * | 2/1986 | Foss | B05D 1/60 427/237 |
| 4,942,018 A | 7/1990 | Munk | |
| 5,393,103 A * | 2/1995 | Cretzler | F16L 21/00 156/294 |
| 5,472,436 A | 12/1995 | Fremstad | |
| 5,534,068 A | 7/1996 | Beach et al. | |
| 8,133,512 B2 | 3/2012 | Kunzler et al. | |
| 8,372,046 B2 | 2/2013 | Meng et al. | |
| 8,404,265 B2 | 3/2013 | Chauhan et al. | |
| 8,404,271 B2 | 3/2013 | Byrne et al. | |
| 8,623,400 B2 | 1/2014 | Liu et al. | |
| 8,663,194 B2 | 3/2014 | Ambati et al. | |
| 9,086,580 B2 | 7/2015 | Grant et al. | |
| 9,091,865 B2 | 7/2015 | Hofmann et al. | |
| 9,421,126 B2 | 8/2016 | Alster et al. | |
| 9,655,774 B2 | 5/2017 | Tai et al. | |
| 9,763,825 B2 | 9/2017 | Tai et al. | |
| 9,782,346 B2 | 10/2017 | Venkatraman et al. | |
| 9,937,073 B2 | 4/2018 | De Juan, Jr. et al. | |
| 10,092,387 B2 | 10/2018 | Tai et al. | |
| 2008/0035875 A1 | 2/2008 | Tai et al. | |
| 2008/0169427 A1* | 7/2008 | Hatem | C23C 14/246 250/429 |
| 2008/0231799 A1 | 9/2008 | Iuliano | |
| 2008/0286338 A1 | 11/2008 | Rosenthal et al. | |
| 2010/0114309 A1 | 5/2010 | de Juan, Jr. et al. | |
| 2010/0217209 A1 | 8/2010 | Meng et al. | |
| 2011/0116035 A1 | 5/2011 | Fritsch et al. | |
| 2011/0184358 A1 | 7/2011 | Weiner et al. | |
| 2011/0282328 A1 | 11/2011 | Ambati et al. | |
| 2012/0022473 A1 | 1/2012 | Shikamura et al. | |
| 2012/0115189 A1 | 5/2012 | Jovanovich et al. | |
| 2012/0268712 A1 | 10/2012 | Egan et al. | |
| 2012/0302972 A1 | 11/2012 | Higuchi | |
| 2014/0005514 A1 | 1/2014 | Pugh et al. | |
| 2014/0193045 A1 | 7/2014 | Otis et al. | |
| 2014/0235457 A1 | 8/2014 | Esfandyarpour et al. | |
| 2015/0111023 A1 | 4/2015 | Tai et al. | |
| 2015/0293031 A1 | 10/2015 | Fisk | |
| 2017/0001195 A1 | 1/2017 | Unger et al. | |
| 2017/0136463 A1 | 5/2017 | Tai et al. | |
| 2018/0333298 A1 | 11/2018 | Tai et al. | |

FOREIGN PATENT DOCUMENTS

| | | |
|---|---|---|
| WO | 2010041230 | 4/2010 |
| WO | 2016061125 | 4/2016 |
| WO | 2017/070528 | 4/2017 |

OTHER PUBLICATIONS

Chang et al., "Packaging Study for a 512-Channel Intraocular Epiretinal Implant", IEEE, MEMS 2013, Taipei, Taiwan, Jan. 20-24, 2013, pp. 1045-1048.

Chang et al., "High Yield Packaging for High-Density Multi-Channel Chip Integration of Flexible Parylene Substrate", IEEE, MEMS 2012, Paris, France, Jan. 29-Feb. 2, 2012, pp. 353-356.
Kang et al., "Effects of Deposition Temperature on Parylene-C Properties", IEEE, MEMS 2013, Taipei, Taiwan, Jan. 20-24, 2013, pp. 389-392.
Kramer et al., "Polymerization of Para-Xylylene Derivatives (Parylene Polymerization). I. Deposition Kinetics for Parylene N and Parylene C", Journal of Polymer Science, Polymer Chemistry Edition, vol. 22, 1984, pp. 475-491.
Metzen et al., "Diffusion Limited Tapered Coating with Parylene C", IFMBE Proceedings 25/IX, 2009, pp. 96-97.
Metzen et al., "Diffusion-Limited Deposition of Parylene C", Journal of Microelectromechanical Systems, vol. 20, No. 1, Feb. 2011, pp. 712-724.
International Search Report and Written Opinion dated Jan. 10, 2017, for corresponding PCT Application No. PCT/US2016/058200 filed Oct. 21, 2016, 13 pages.
Ramachandran et al., "A Study of Parylene C Polymer Deposition Inside Microscale Gaps", IEEE Transactions on Advanced Packaging, vol. 30, No. 4, Nov. 2007, pp. 712-724.
Sawano et al., "Sealing Method of PDMS as Elastic Material for MEMS", IEEE, MEMS 2008, Tucson, Arizona, Jan. 13-17, 2008, pp. 419-422.
Senkevich et al., "Thermomechanical Properties of Parylene X, A Room-Temperature Chemical Vapor Depositable Crosslinkable Polymer", Chemical Vapor Deposition, 13, 2007, pp. 55-59.
Wang et al., "Reliable Deposition of Ultra-Thin Parylene", IEEE 2016, MEMS 2016, Shanghai, China, Jan. 2016, pp. 462-464.
PCT/US2016/058200, "International Preliminary Report on Patentability", dated May 3, 2018, 12 pages.
PCT/US2015/055368, "International Preliminary Report on Patentability", dated Apr. 27, 2017, 10 pages.
PCT/US2015/055368, "International Search Report and Written Opinion", dated Feb. 16, 2016, 14 pages.
"Compliance Problems with Glaucoma Eye Drops", OpthalmologyWeb, Available Online At: https://www.ophthalmologyweb.com/Featured-Articles/19875-Compliance-Problems-with-Glaucoma-Eye-Drops/, Aug. 23, 2010, 3 pages.
"How to Succeed at Eye Drop Treatment: It's All in Your Hands", Glaucoma Center of Excellence, Available online At: https://www.hopkinsmedicine.org/wilmer/services/glaucoma/book/chapter_how_to_succeed_with_drops.html, Accessed from Internet on Jun. 14, 2019, 7 pages.
"Improving Compliance Through Access to Eye Drop Medication", Available online At: https://www.cameron-graham.co.uk/pages/pharmacists.php, Accessed from Internet on Jun. 14, 2019, 2 pages.
"The Role of the Pharmacist in Improving Glaucoma Compliance", Ear and Eye Care, NI Pharmacy in Focus, Available online At: https://www.cameron-graham.co.uk/pages/pharmacists.php, Aug. 2005, 1 page.
EP16858334.2, "Extended European Search Report", dated Jul. 23, 2019, 8 pages.
PCT/US2019/033369, "International Preliminary Report on Patentability", dated Dec. 3, 2020, 8 pages.
PCT/US2019/033369, "International Search Report and Written Opinion", dated Sep. 17, 2019, 11 pages.
PCT/US2019/036498, "International Preliminary Report on Patentability", dated Dec. 24, 2020, 9 pages.
PCT/US2019/036498, "International Search Report and Written Opinion", dated Oct. 31, 2019, 12 pages.
Robin, "Beyond Compliance: Getting the Drops In", Review of Ophthalmology, Available online At: https://reviewofophthalmology.com/article/beyond-compliance-getting-the-drops-in, Feb. 18, 2010, 5 pages.

* cited by examiner

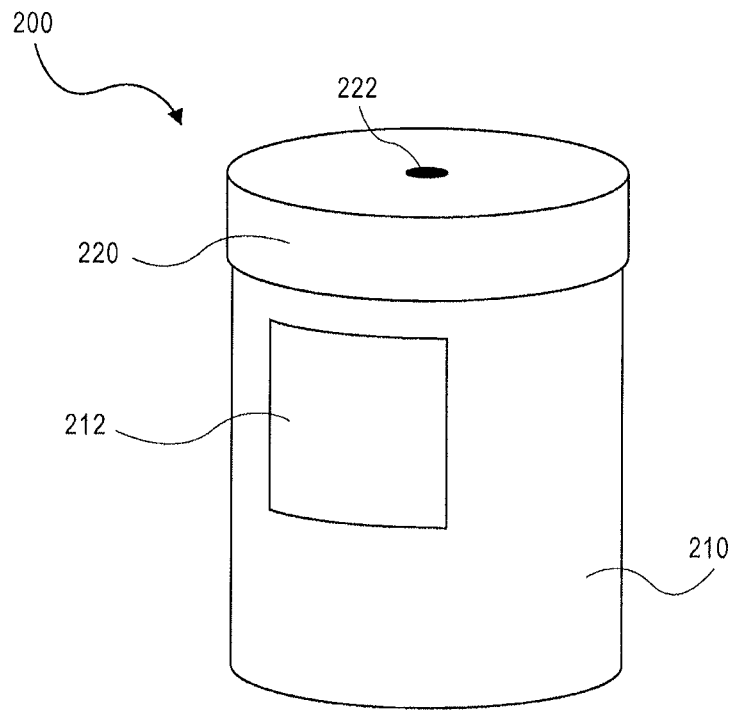
FIG. 2A
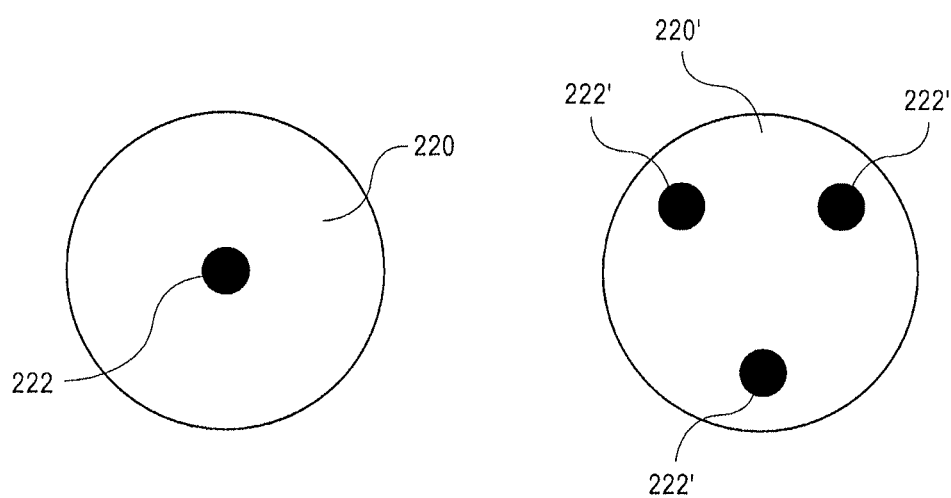
FIG. 2B                FIG. 2C

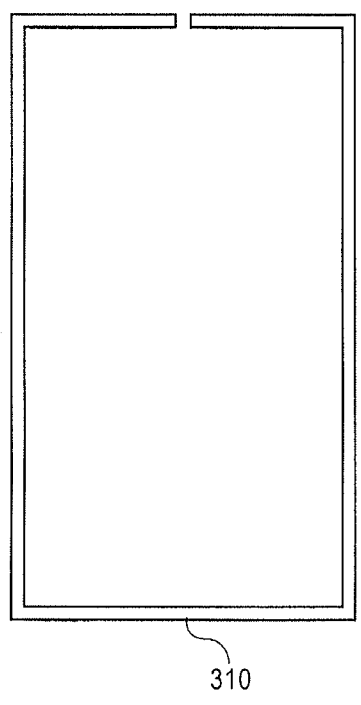 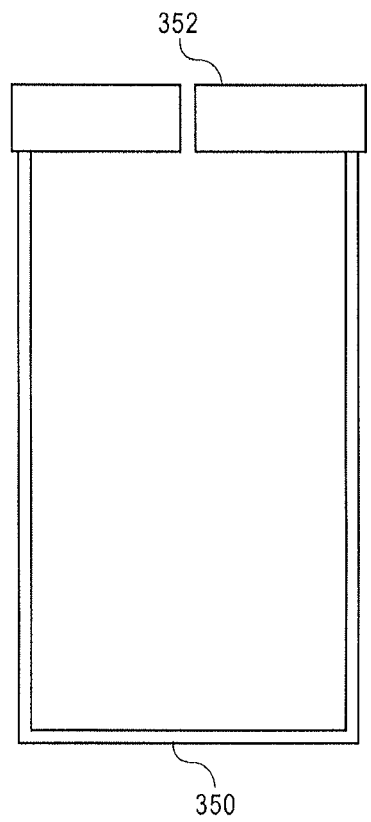
FIG. 3A          FIG. 3B

RELIABLE DEPOSITION OF THIN PARYLENE

CROSS-REFERENCES TO RELATED APPLICATIONS

This application claims priority to U.S. Patent Application No. 62/245,421, filed Oct. 23, 2015, the teaching of which is hereby incorporated by reference for all purposes.

STATEMENT AS TO RIGHTS TO INVENTIONS MADE UNDER FEDERALLY SPONSORED RESEARCH AND DEVELOPMENT

BACKGROUND

1. Field of the Art

Embodiments of the present invention generally relate to vapor deposition of polymers, including parylene, to manufacture a thin polymer film, thinner than 1 micrometer in the case of parylene.

2. Description of the Related Art

Parylene is a generic name for members of a series of poly(p-xylylene) polymers. Parylene polymer is known to excel as a dielectric and as a water vapor barrier without being toxic. Having been commercialized in the 1960s, parylene has found widespread use in the electronics, automotive, aerospace, medical, and other industries. It generally has preferable chemical vapor depositing attributes compared to other conformal coating materials such as acrylics, epoxies, polyurethanes, and silicones.

Parylene N is the basic member of the series. It is commonly derived from [2.2]paracyclophane, which can be synthesized from p-xylene. Parylene N is typically a completely linear, highly crystalline material.

Parylene C, which has one chlorine group per repeat unit, is another of the series. It is typically produced from the same dimer as parylene N but having a chlorine atom substituted for one of the aromatic hydrogen atoms. Its ease of use and especially well-mannered chemical vapor deposition characteristics make it ideal for use as a conformal coating on printed circuit boards and as a structure or sacrificial intermediate in nanofabricated devices. Its demonstrated bio-compatibility as a United States Pharmacopeial Convention (USP) Class VI biocompatible polymer makes it suitable for medical devices.

Parylene D, which has two chlorine groups per repeat unit, is another common parylene of the series. Although it has better diffusion characteristics than parylene C, parylene D generally deposits less uniformly than parylene C.

Parylene AF-4, with the alpha hydrogen atoms of the N dimer replaced with fluorine, is another parylene of the series. Parylene AF-4 is also known as Parylene SF when manufactured by Kisco Conformal Coating, LLC of California (a subsidiary of Kisco Ltd. of Japan) or PARYLENE HT® when manufactured by Specialty Coating Systems, Inc. of Indianapolis, Ind.

Other parylenes, such as parylene VT-4, parylene A, parylene AM, and parylene X, are known in the art and are used for specialized products in industry.

Fundamental aspects of parylene N and parylene C are detailed in P. Kramer et al., "Polymerization of Para-Xylylene Derivatives (Parylene Polymerization). I. Deposition Kinetics for Parylene N and Parylene C," *Journal of Polymer Science: Polymer Chemistry Edition*, Vol. 22 (1984), pp. 475-491. This journal article is hereby incorporated by reference in its entirety for all purposes.

Fundamental aspects of parylene X are detailed in J. Senkevich et al., "Thermomechanical Properties of Parylene X, A Room-Temperature Chemical Vapor Depositable Crosslinkable Polymer," *Chem. Vap. Deposition*, 2007, 13, pp. 55-59. This journal article is hereby incorporated by reference in its entirety for all purposes.

Parylene is widely used in a number of applications because of its chemical vapor depositing attributes. For example, parylene is a very popular polymer in micro-electro-mechanical systems (MEMS), with widespread use in substrates for flexible devices or packaging shell for micro-implant devices. Thin (e.g., less than 1 micrometer) parylene deposition has been utilized to seal permeable sites of polydimethylsiloxane to tune the small-molecule diffusivity or gas permeability of substrate. It has also been reported that an ultra-thin parylene film (e.g., having a thickness in the nanometer range) was able to function as a nanoporous coating of electrode to stabilize the electrode/electrolyte interface.

The manufacturing process of thick parylene is well established. Thick parylene films, typically thicker than 1 micrometer, can be efficiently manufactured. The manufacturing process utilizes an amount of a parylene dimer, which is then vaporized and subjected to pyrolysis to turn it into an amount of monomer, and then deposited at lower temperature (e.g., at room temperature, or at a particular temperature between 173.0 and 373.0 K) on a substrate. Many parylene deposition systems exist and implement these manufacturing steps.

For thin and ultra-thin parylene, the manufacturing process is not as efficient and repeatable, and introduces impurities. A thin parylene film is typically less than 1 micrometer thick. An ultra-thin parylene film has a thickness in the nanometer range. The manufacturing process utilizes the same steps above and is conducted using any of the existing parylene deposition systems. The difference is that a much smaller amount of parylene dimer is loaded into the parylene deposition system.

For example, all the thicknesses of ultra-thin parylene that have been reported so far were controlled only by varying the loading masses. To prepare a ultra-thin parylene film, the loaded dimer weight was proportionally low. In the case of depositing a 20 nm parylene C film, only one or two dimer granules are required, which makes the thickness control rather difficult and unrepeatable.

Because of the small amount, the deposition occurs in a flash and is not highly controllable. The deposition process is too fast, since it takes an awfully short time to burn up all the dimers when the loading dimer weight is very low. The fast deposition process is dynamic in nature, and would never reach a steady state in the deposition chamber characterized by the constant coating pressure at the set point, which may considerably degrade the quality of the ultra-thin parylene film. This result in a high error rate (e.g., number of films of the desired thickness relative to undesired thicknesses) in the range of 50% for thin parylene and can approach 100% for ultra-thin parylene. Further, any impurity in the small amount of parylene dimer significantly impacts the quality of the resulting film.

There is a need in the art for a controllable and repeatable vapor deposition of parylene to manufacture high quality thin and ultra-thin parylene films.

BRIEF SUMMARY

Generally, apparatus, system, and method of depositing thin and ultra-thin parylene are described. A parylene deposition system includes a machine chamber depositing thick parylene (e.g., with a thickness larger than 1 µm) at a particular deposition pressure and deposition temperature. Monomeric gas generated based on parylene dimer is used for the deposition. A core deposition chamber is placed in the machine chamber. To highlight this placement, the machine chamber is also referred to herein as an outer machine chamber. The core deposition chamber contains a component, such as a substrate or a MEMS device to be coated with parylene. The deposition chamber also includes a conduit through a surface, such that the conduit connects the inside to the outside of the deposition chamber. The monomeric gas effuses and/or diffuses from the machine chamber into the deposition chamber via the conduit. While the deposition temperature is relatively unchanged, the deposition pressure inside the deposition chamber is relatively smaller. Hence, the deposition of the parylene inside the deposition chamber occurs at the lower pressure and results in a much thinner (e.g., less than 1 µm) parylene film.

An embodiment of a parylene deposition metering apparatus is described. The apparatus includes a based. The apparatus also includes a rigid, removable cover configured to mate and seal with the base to create an enclosed core deposition chamber and define an inside and an outside of the core deposition chamber. The base and the cover are configured to withstand an internal vacuum pressure relative to the outside of at least 1.0 Pa. The apparatus also includes a conduit through a top of the cover. The conduit has a lumen connecting the inside to the outside of the core deposition chamber. The lumen has a length and a cross-section. The cross-section has a width between 50 µm and 6000 µm. The length is less than 140 times the cross-section width. The core deposition chamber can be placed in an outer deposition chamber and can achieve parylene deposition less than 1 µm thick inside the core deposition chamber.

In an example, the cross-section is circular and the cross-section width is a diameter. The cross-section diameter and length are configured to enable controlled effusion of an outside parylene monomer at a pressure between 1.0 and 20.0 Pa and a temperature between 173.0 and 373.0 K through the lumen to the inside of the core deposition chamber. The effusion results in a reduced deposition rate compared to outside of the core deposition chamber.

In an example, the apparatus also includes at least one notch along a secant of the conduit at a predetermined axial position of the conduit. This notch enables a user to more easily cut or sever the conduit to a new, predetermined length. By doing so, the user can controllably change the rate of effusion/diffusion of monomeric gas into the deposition chamber, thereby altering the pressure differential and the resulting parylene deposition rate.

In an example, the length of the conduit is less than 40 times the cross-section width for parylene C deposition. The length is also greater than 7 times the cross-section width.

In an example, the core deposition chamber has a volume between 1 cubic centimeter and 10,000 cubic centimeters. The conduit is defined by a tube that extends through the top of the cover of the core deposition chamber. Alternatively, the conduit is defined merely by an opening, such as an orifice or a slit, through the top of the cover.

In an example, the base includes a rigid, removable tray that is opposite to the cover and that is configured to mate and seal with the based and to retain a substrate inside the core deposition chamber. The distance between an inner side of the cover and an inner side of the tray is between 1 centimeter and 40 centimeters.

In an example, the apparatus further includes a label that identifies at least one of a dimension of the conduit, a pressure differential relative to a pressure inside the core deposition chamber, or an identifier of the core deposition chamber. The label is attached to the cover and includes a radio frequency identifier-identification (RFID) tag or a barcode that encodes the at least one of: the dimension, the pressure differential, or the identifier.

An embodiment of a parylene deposition system is described. The system includes a vaporizer configured to vaporize a polymer dimer into a dimeric gas. The system also includes a pyrolysis tube connected to the vaporizer and configured to pyrolize the dimeric gas into a monomeric gas. The system also includes an outer deposition chamber connected to the pyrolysis tube and having an interior configured to receive the monomeric gas. The system also includes a core deposition chamber placeable in and removable from the outer deposition chamber and configured to effuse the monomeric gas from interior of the outer deposition chamber into an interior of the core deposition chamber.

In an example, the system also includes a label reader. The system is configured to set a deposition time and a pressure inside the outer parylene deposition chamber based on a read of a label by the label reader, where the label is attached to the core deposition chamber.

In an example, the system also includes a user interface configured to receive user input specifying a deposition time and a pressure within the outer parylene deposition chamber.

An embodiment of a method of depositing parylene onto a micro-electro-mechanical systems (MEMS) device is described. The method includes vaporizing a parylene dimer into a dimeric gas in a vaporizer. The method also includes pyrolizing the dimeric gas into a monomeric gas in a pyrolysis tube connected to the vaporizer. The method also includes receiving the monomeric gas in an outer deposition chamber connected to the pyrolysis tube. The method also includes effusing the monomeric gas into a core deposition chamber from the outer deposition chamber. The method also includes depositing parylene, based on the monomeric gas effused into the core deposition chamber, onto a surface of a MEMS device contained in the core deposition chamber.

In an example, the vaporizer, the pyrolysis tube, the outer deposition chamber belong to a parylene deposition system, and the vaporization is triggered by input at a user interface of the parylene deposition system. The input specifies a pressure inside the outer deposition chamber and a deposition time. A thickness of deposited parylene onto the surface of the MEMS device is based on the deposition time and a pressure differential between the pressure inside the outer deposition chamber and a pressure inside the core deposition chamber. Additionally or alternatively, the input specifies a thickness of deposited parylene onto the surface of the MEMS device.

A further understanding of the nature and the advantages of the embodiments disclosed and suggested herein may be realized by reference to the remaining portions of the specification and the attached drawings.

BRIEF DESCRIPTION OF THE DRAWINGS

FIG. 2A illustrates a core deposition chamber that includes a cover in accordance with an embodiment.

FIG. 2B illustrates a top view of an example cover that includes a single conduit in accordance with an embodiment.

FIG. 2C illustrates a top view of an example cover that includes a plurality of conduits in accordance with an embodiment.

FIG. 3A illustrates a deposition chamber that is integrally formed, where a cover and a base are a single part structure in accordance with an embodiment.

FIG. 3B illustrates a deposition chamber that is not integrally formed, where a cover is removable from a base in accordance with an embodiment.

DETAILED DESCRIPTION

Figure 1A:
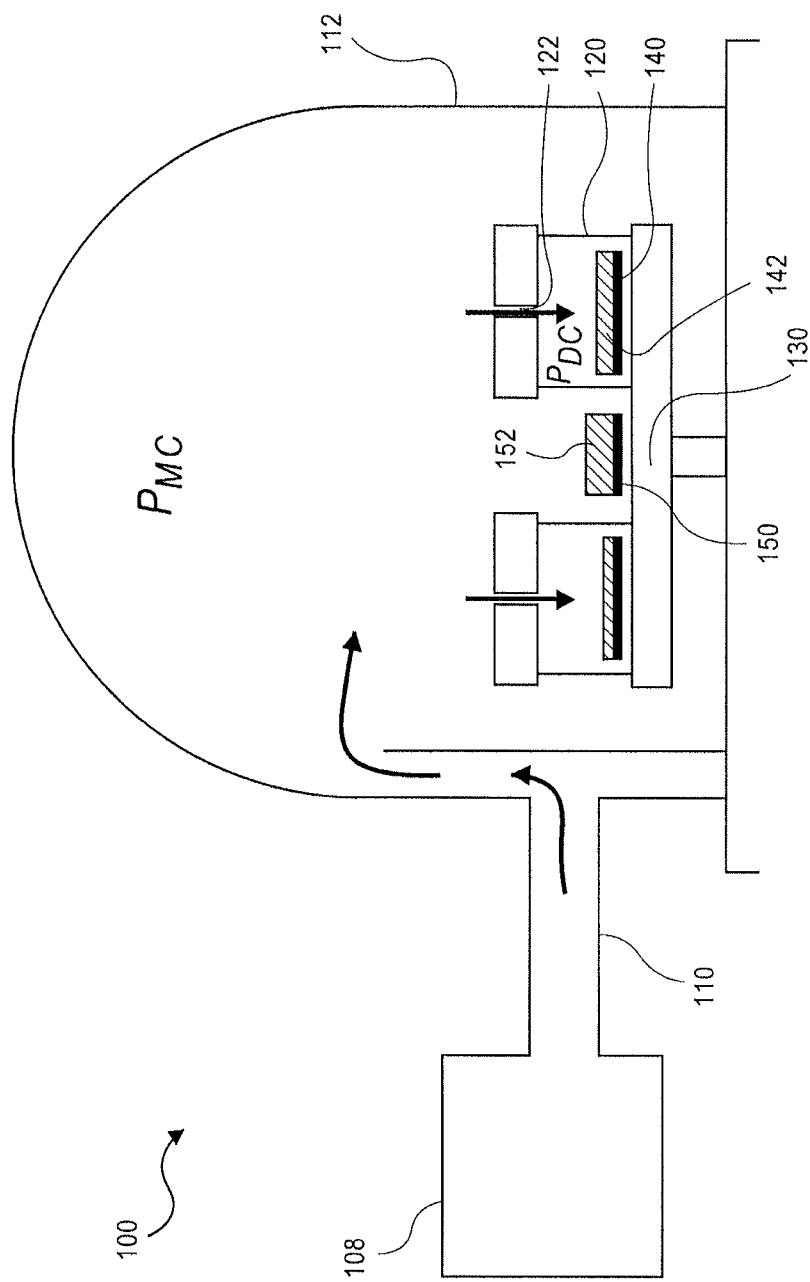
FIG. 1A diagrams a manufacturing system in accordance with an embodiment.

Techniques are described for a controllable and repeatable vapor deposition of parylene to manufacture high quality thin and ultra-thin parylene films. The techniques can be implemented in connection with existing parylene deposition systems without changes thereto. More specifically, the flash manufacturing process of thin and ultra-thin parylene in such systems is avoided. Instead, the controllable, repeatable, and high quality manufacturing process of thick parylene is adapted to manufacture thin and ultra-thin parylene. Any desired thickness of parylene films, down to the nanometer range, can be achieved with a high level of control and repeatability, and at a high quality.

Generally, a parylene deposition system includes a parylene deposition chamber where a substrate may be placed and parylene may be deposited at room temperature under a particular pressure. In the interest of clarity of explanation, this chamber is referred to herein as an "outer deposition chamber" or, equally, "a machine chamber." The pressure at which deposition occurs is referred to herein as "pressure in machine chamber," or "$P_{MC}$" for short. From an amount of parylene dimer, thick parylene is manufactured in part based on chemical vapor deposition (CVD) in the machine chamber at $P_{MC}$.

To manufacture thin and ultra-thin parylene, embodiments of the present disclosure include a second parylene deposition chamber. This new chamber is referred to herein as a "core deposition chamber" or, equally "deposition chamber." The deposition chamber is relative smaller than the machine chamber and includes a conduit. The conduit has a lumen that connects the inside to the outside of the deposition chamber. The conduit can be sized (e.g., in length, cross-section, or both) to create a mean free path for molecular gas, resulting in a particular rate of effusion and/or diffusion.

When the deposition chamber is placed inside the machine chamber and CVD is triggered, the pressure inside the machine chamber is $P_{DC}$. However, the pressure inside the deposition chamber is much lower because of the molecular effusion and/or diffusion through the lumen of the conduit. This pressure is referred to herein as "pressure in deposition chamber," or "$P_{DC}$" for short. Hence, any parylene deposition within the deposition chamber occurs at $P_{DC}$ rather than the much larger $P_{MC}$.

The thickness of the parylene film depends on the pressure at which CVD occurs, among other factors. Because of the relatively smaller pressure $P_{DC}$, the deposition chamber is usable to manufacture thin and ultra-thin parylene film based on amount of parylene dimer usable for thick parylene manufacturing. For example, instead of attempting to flash manufacture a 20 nm parylene C film by using one or two dimer granules, a much more prolonged and controlled manufacturing is possible with a much larger amount of dimer granules. Continuing with this example, if the pressure ratio between $P_{DC}$ and $P_{MC}$ is 1-to-100 and if the machine chamber would have been used to manufacture a 2 µm parylene film given the proper amount of dime granules and a certain deposition time, the deposition chamber can likewise be used to manufacture the 20 nm parylene C film.

In an example, a substrate is placed inside the deposition chamber. The deposition chamber is then placed inside the machine chamber. An amount of dimer sufficient for thick parylene manufacturing is loaded into the parylene deposition system and CVD is triggered in the machine chamber at $P_{MC}$. The low $P_{DC}$ inside the deposition chamber helps to achieve a thin or ultra-thin parylene deposition on a surface of the substrate.

In the interest of clarity of explanation, the embodiments of the present disclosure are described in connection with parylene deposition. However, the embodiments are not limited as such. Instead, the embodiments similarly apply to CVD of other polymers. Specifically, a deposition chamber can be formed similarly to the embodied core deposition chamber. The deposition chamber and its conduit can be sized to facilitate a particular effusion and/or diffusion rate given the molecular gas used in the CVD.

Figure 1B:
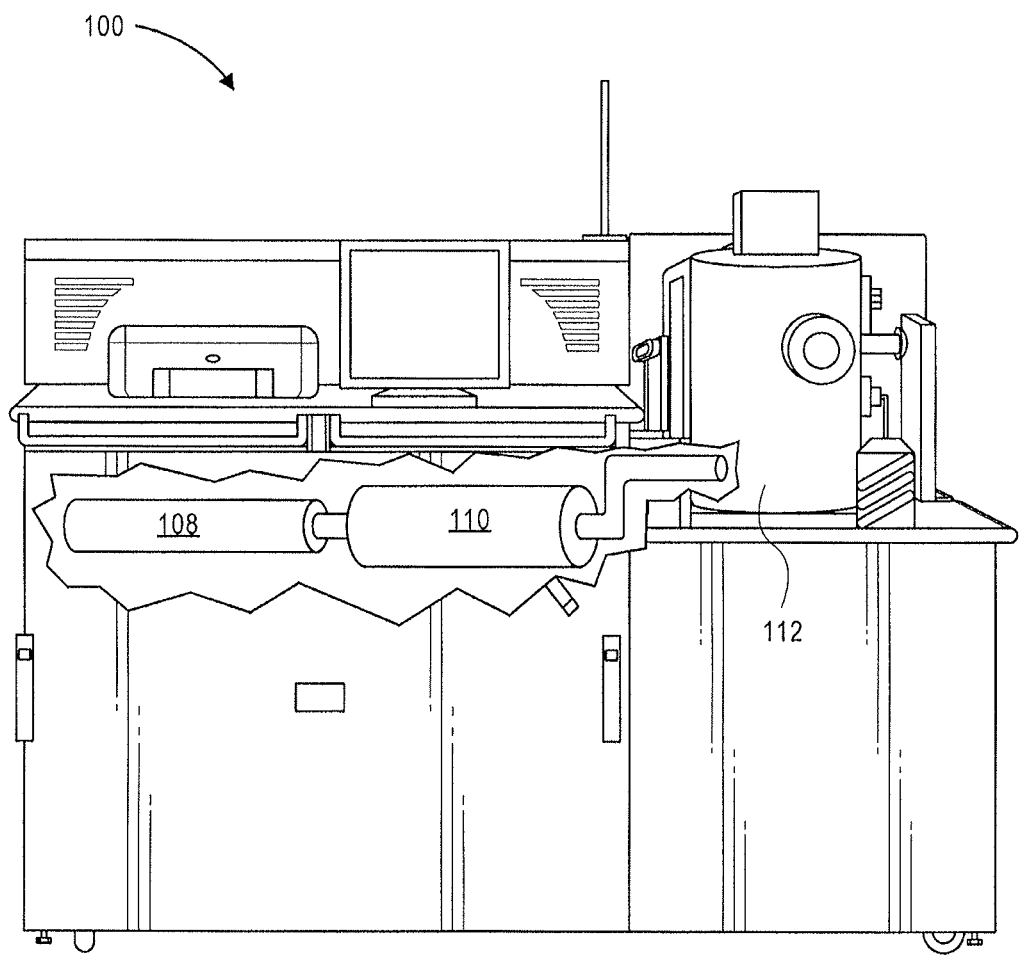
FIG. 1B illustrates a laboratory-based vapor deposition polymerization machine in accordance with an embodiment.

FIGS. 1A and 1B are a manufacturing system diagram and elevation view of a corresponding physical laboratory-grade machine in accordance with an embodiment. In a vapor deposition polymerization system 100, there is a vaporizer 108, a pyrolysis tube 110, and a machine chamber 112. The vapor deposition polymerization system 100 is an example of a parylene deposition system.

Powdered dimer is loaded into the vaporizer 108 and then vaporized into a dimeric gas. The dimeric gas passes to the pyrolysis tube 110, where it is pyrolized into a monomeric gas. The monomeric gas then is fed into the interior of the machine chamber 112. The monomeric gas represents an amount of monomers in a gaseous state.

In the machine chamber 112, the monomeric gas in its gaseous state is generally at room temperature (e.g., 25° C.) and can be deposited at that temperature to form a parylene layer, which may be referred to herein as a parylene film. The thickness of the parylene layer depends on the pressure $P_{DC}$ inside the machine chamber 112 and the deposition time, among other factors. The higher the pressure, the thicker the layer is. The longer the time, the thicker the layer is too.

In an example, Coating Systems, Inc. of Indianapolis, Ind., U.S.A., manufactures the SCS PDS 2035CR Parylene Deposition System. In its vaporization chamber, dimer di-para-xylylene is vaporized at 150° C. at 1.0 torr. In its pyrolysis chamber, monomer para-xylylene is pyrolized at 680° C. at 0.5 torr. In its machine chamber, polymer polylpara-xylylene is deposited at 25° C. at 0.1 torr. In such a deposition system, parylene coatings can range in thickness from hundreds of angstroms to several mils (i.e., thousandths of an inch). A typical thickness is in the micron (μm) range.

To reduce the thickness from the micron range down to the nanometer range, the embodiments of the present disclosure also include a set of deposition chambers 120 that can be placed in the interior of the machine chamber 112. FIG. 1 illustrates two of such chambers 120, although a lower or higher number is possible.

Placing a deposition chamber 120 can be temporary for at least the duration of parylene deposition. In other words, the deposition chamber 120 can be placed in the machine chamber 112 before the start of the deposition. Once the deposition is complete, the deposition chamber 120 can be removed from the machine chamber 112. In this case, rather than coating a substrate by placing it directly in the machine chamber 112, the substrate is placed first in the deposition chamber 120, which is then placed in the machine chamber 112.

An advantage of the temporary placement is that the deposition chamber 120 can be adapted for use in an existing parylene deposition system without having to alter such a system. Another advantage is that the deposition chamber 120 can be disposable. In other words, after a predefined number of parylene depositions, the deposition chamber 120 need no longer be utilized and may be decommissioned. A new deposition chamber 120 would be used instead. In this way, any impurities or changes to an otherwise over-utilized deposition chamber 120 would not become a factor that could negatively impact the quality of the parylene deposition.

In another example, placing the deposition chamber 120 can involve a permanent installation or integration of this chamber 120 within the machine chamber 112. In this case, the parylene deposition chamber 120 is a structure integral to the vapor deposition polymerization system 100.

A rotating platform 130, such as a turn plate, can also be installed in the interior of the machine chamber 112. The rotation platform 130 includes a base and a tray that form a T-shaped structure. The rotation occurs around the base. A top surface of the tray can be used to place the set of deposition chambers 120. If the set includes multiple deposition chamber 120, they can be uniformly distributed along the tray. For example, the tray can include evenly distributed notches, where each note is sized to receive one deposition chamber 120. During parylene deposition, the tray is rotated around the base such that the monomeric gas in the interior of the machine chamber 112 is uniformly distributed to the interiors of the deposition chamber 120.

The vapor deposition polymerization system 100 can include a user interface, such as a set of hard or soft buttons and/or a graphical user interface (GUI) for receiving user input that specifies the pressure $P_{DC}$, the deposition time, a thickness of the parylene layer, and/or other deposition-related factors. Given the input, a processor (not shown) of the vapor deposition polymerization system 100 accesses control parameters and instructions from a memory (not shown) of the vapor deposition polymerization system 100. The processor then executes the instructions to control CVD according to the control parameters. For example, the control parameters can set the deposition time or control the pressure $P_{DC}$ inside the machine chamber 112.

Although not shown in FIGS. 1A and 1B, the vapor deposition polymerization system 100 can also include a label reader, such as a radio frequency identification (RFID) reader or a barcode reader. The label reader can be installed in proximity of the machine chamber 112 or within its interior. The label reader is configured to read a label, such as an RFID tag or a barcode, attached to a deposition chamber 120. The data read from the label is transmitted to the processor.

In an example, the label of a deposition chamber 120 stores or encodes a dimension of a conduit of the deposition chamber 120, a pressure differential relative to a pressure inside the deposition chamber 120, or an identifier of the deposition chamber 120. The memory of the vapor deposition polymerization system 100 can store control parameters for controlling the parylene deposition given any of such readable data. For example, tabulated deposition times and pressures $P_{DC}$ for different parylene thicknesses are correlated and stored per conduit dimension, pressure differential, or deposition chamber identifier. Hence, upon a read of data encoded in the label of the deposition chamber 120 and upon input at the user interface specifying a desired thickness, the proper control parameters can be retrieved from the memory and used to automatically set the proper deposition time and pressure $P_{DC}$.

Further, the memory can store a predefined number of times that a deposition chamber 120 can be utilize. Upon a read of the respective label, the identifier of the deposition chamber 120 is retrieved and a counter is incremented and stored in the memory. If the counter reaches the predefined number of times, a recommendation can be provided at the user interface to dispose of or replace the deposition chamber 120.

In an example, the deposition chamber includes a conduit 122. The conduit 122 has a lumen that connects the inside to the outside of the deposition chamber 120. Hence, when placed in the machine chamber 112, the lumen connects the interior of the deposition chamber 120 to the interior of the machine chamber 112. A volume of the deposition chamber 120 is large enough to contain a component 140 that needs to be coated with parylene. Example components include substrates and MEMS devices, among other components. Once coated, the component 140 includes a parylene layer 142 (referred to also a parylene film and a parylene coating). The conduit 122 and means for retaining a component are further described in connection with the next figures. Briefly, the conduit 122 can be an opening, a slit, or a tube through a surface of the deposition chamber 120 The retention means can include a notch or a tray at an opposite surface.

When placed in the machine chamber 112 and CVD is triggered, the conduit 122 transports monomeric gas (or an amount of monomers) into the deposition chamber 120 from the machine chamber 112. Depending on a dimensions of the conduit 122 (e.g., the length, the cross-section, or both), the transportation includes an effusion and/or a diffusion of the monomeric gas. This transportation results in a lower pressure $P_{DC}$ inside the deposition chamber 120 relatively to the pressure $P_{MC}$ in the machine chamber 112. The pressure differential results in a lower deposition rate inside the deposition chamber 120. This deposition rate may be a function of (e.g., proportional to) the ratio of $P_{DC}$ over $P_{MC}$. For instance, if the ratio is 1-to-100, then a deposition rate in the machine chamber 112 is reduced by two orders of magnitude of in the deposition chamber 120. In other words, if a 1 μm thick parylene film is producible in the machine chamber 112 over a deposition time, a 10 nm thick parylene film is producible in the deposition chamber 120 over the same deposition time.

The volume of the deposition chamber 120 is generally smaller than the volume of the machine chamber 112 to allow the placement. If a rotating platform 130 is used, dimensions of the deposition chamber 120 can also be defined dependently on the dimensions of the rotating platform 130. In an example, the diameter of the t rotating platform 130 is about 22 cm and the height of the machine chamber 112 is about 50 cm. In this example, the volume of the deposition chamber 120 can be set to $0.25 \times \pi \times 22^2 \times 30 = 10,000$ cm$^3$ or higher. However, the larger the inner surface area of the deposition chamber 120 becomes, the thinner the parylene layer can be obtained. On the other hand, there is no lower bound on the volume of the deposition chamber 120. It can be as small as 1 cm$^3$. If smaller than 1 cm$^3$, manipulating the deposition chamber 120 can be difficult.

Hence, a component is placed in the deposition chamber 120. The deposition chamber 120 is then placed onto the rotating platform 130. An amount of parylene dimer is loaded into the vapor deposition polymerization system 100. User input is received at the user interface to trigger the CVD. The parylene dimer is vaporized in the vaporizer 108 into a dimeric gas. The dimeric gas is pyrolized in the pyrolysis tube 110 into a monomeric gas. The deposition chamber 120 receives the monomeric gas. An amount of this gas effuses and/or defuses into the deposition chamber 120. Parylene deposition occurs accordingly in the deposition chamber 120 and coats a surface of the component with a thin or ultra-thin layer of parylene.

The deposition chamber 120 acts a metering apparatus for the monomeric gas, thereby controlling the parylene deposition therein. The conduit 122 acts a flow controller that meters the intake of the monomeric gas, thereby reducing the pressure $P_{DC}$ inside the deposition chamber relative to the outside pressure $P_{MC}$. The controlled deposition occurs at the lower pressure $P_{DC}$ resulting in thin or ultra-thing parylene coatings.

As illustrated in FIG. 1, the component 140 is placed inside the deposition chamber 120, resulting in a parylene layer 142. The parylene layer 142 has a thickness ($t_{DC}$) that is less than 1 μm). In comparison, a similar component 150 (e.g., a different unit of the same component 140) can also be placed inside the machine chamber 112 (e.g., on the rotating platform 130, outside of any deposition chamber 120). Parylene is deposited on the component 150, in parallel to the parylene deposition on the component 140. This results in a thicker parylene layer 152 (with a thickness $t_{MC}$) on the component 150. The parylene layer 152 is thicker than the parylene layer 142 because the pressure $P_{MC}$ inside the machine chamber 112 is larger than the pressure $P_{DC}$ inside the deposition chamber 120.

FIG. 2A illustrates an example of a core deposition chamber 200. Generally, the deposition chamber 200 includes a top surface, a bottom surface, and a number of walls that connects the top surface and the bottom surface. As described herein above, the deposition chamber 200 is placeable in and removable from a machine chamber. Monomeric gas in the machine chamber effuses and/or defuses into the interior of the deposition chamber 200, such as the volume defined between the top surface, the bottom surface, and the wall(s).

Generally, the deposition chamber 200 can have different shapes and dimensions. FIG. 2A illustrates a cylindrical shape. Other shapes are likewise possible including cubic, cuboid, hexagon, cone, pyramid, and other shapes. The distance between the inner side of the top surface and the inner side of the bottom surface (e.g., the internal height of a wall) varies between 1 cm and 40 cm. The cross section of the top surface varies between 1 cm and 25 cm.

In an example, the wall(s) and the bottom surface define a base 210 of the deposition chamber 200. Different materials are possible for the base 210 including, paper (e.g., a thick cardboard), plastic, glass, ceramic, and/or metal. In an example, the bottom surface and the wall(s) are integrally formed such that the bases 210 is a single part structure. As used herein, "integrally formed" parts include those that are deposited, etched, cured, or formed at the same time as one another such that the result is that they are connected by a common material with one another, or as otherwise known in the art. In another example, the bottom surface is a different part from the wall(s) such that the base 210 is not integrally formed. For example, the bottom surface can be a rigid, removable tray or bottom cover that mates with the wall(s), where the mating is at the bottom end(s) of the wall(s). These and other configurations of the bottom surface and wall(s) are further described in connection with FIGS. 4A-C.

In an example, the top surface defines a cover 220 (e.g., a top cover) of the deposition chamber 200. Different materials are possible for the cover 220 including, paper (e.g., a thick cardboard), plastic, glass, ceramic, and/or metal. In an example, the cover 220 and the wall(s) are integrally formed. In this example, the cover 220 and the base 210 (e.g., the wall(s) and the bottom surface) can be integrally formed such that the deposition chamber 200 is a single part structure. In another example, the cover 220 is a different part from the base 210 (or the wall(s)) such that the deposition chamber 200 is not integrally formed. For example, the cover 220 can be a rigid, removable cover that mates with the wall(s), where the mating is at the top end(s) of the wall(s). In this example, the cover 220 can be a rigid, removable cover that mates and seals with the base 210 to create an enclosed, core deposition chamber 200 and defines an inside and an outside of the core deposition chamber 200. When mated, the cover 220 and the bases 210 form the core deposition chamber 200 such that this chamber 200 withstands an internal vacuum pressure relative to the outside of at least 1.0 Pa. In other words, the deposition chamber 200 can have a solid, stable structure. These and other configurations of the cover 220 are further described in connection with FIGS. 3A-B.

To facilitate the transportation (e.g., effusion and/or diffusion) of monomeric gas into the deposition chamber 200, at least one of the cover 220 and/or the base 210 includes one or more conduits 222. For more efficient transportation, the cover 220 includes a set of conduits 222, such that gravity can be advantageously used.

FIG. 2B illustrates a top view of an example cover 220, where the cover 220 includes a single conduit 222. In this example, the conduit 222 is through a top of the cover 220 and proximate a center of the top of the cover 220 (e.g., located about the center). The conduit 222 includes a lumen that connects the inside to the outside of the core deposition chamber 200. The conduit 222 can be formed by creating merely an opening through the cover 220, such as an orifice, a hole, or a slit. Alternatively, the conduit can be formed by a tube that extends through the opening. These and other configurations of the conduit 222 are further illustrated in connection with FIGS. 5A-5D.

FIG. 2C illustrates a top view of an example cover 220, where the cover 220 (noted as 220') includes a plurality of conduits 222 (each noted as 222'). In this example, the conduits 222' are uniformly distributed across the top of the cover 220. For instance, the conduits 222' can be at equal distance from each other. In this way, the transportation of the monomeric gas through the conduits 222 can be uniform. However, the distribution of the conduits 222' need not be uniform. It can instead be random. Or, in one example, one of the conduits is centered at the top of the cover 220, while the remaining conduits are uniformly distributed along the center.

Referring now to FIGS. 2A, 2B, and 2C, the lumen of a conduit 222 has a length and a cross-section. In an example, the lumen has a cylindrical shape. In this example, the cross-section can be defined as the diameter of the lumen. However, other shapes are possible. For various shapes, the cross-section can be defined as the surface area at the top end of the lumen (e.g., the surface area through which the monomeric gas enters the lumen).

Two types of monomeric gas transportation are desired: effusion and diffusion. Which transportation type is predominant depends on the length and the cross-section. Generally, effusion is the process of transportation of the monomeric gas when the cross-section is much smaller than the mean free path of the gas molecules. In comparison, diffusion occurs when the diameter is larger than the mean free path. A Knudsen number (Kn) for the monomers can be defined as the ratio of the molecular mean free path length to the cross section. A high Kn number indicates effusion. A low Kn number indicates diffusion. In an example, the length and the cross-section of the lumen are set such that the resulting Kn number of the monomers is between 0.1 and 12. This Kn number range allows a number of ways for dimensioning the length and the cross-section. Generally, the length and the cross-section of the lumen are configured (e.g., sized to create an area of the lumen that results in a particular Kn number) to enable controlled effusion and/or diffusion of an outside parylene monomer at a pressure between 1.0 and 20.0 Pa and at a temperature between 173.0 and 373.0 K through the lumen to the inside of the core deposition chamber 200. The effusion and/or diffusion result in a reduced deposition rate compared to outside of the core deposition chamber 220.

In an example, diffusion can be the predominant transportation type, when the length is much smaller than the cross-section. In this case, the cross-section can be dimensioned between 50 μm and 6 mm. For instance, if a cylindrical lumen is used, its diameter would fall in the 50 μm to 6 mm range. If another shape is used, the largest distance between two points of the cross-section would fall in that range too.

To illustrate, the mean free path of parylene monomer at the deposition condition (35 mTorr (4.6 Pa), 273.14 K) is about 0.6 mm. In this example, a diameter of a cylindrical lumen of the conduit 222 can be less than 6 mm, which guarantees a Kn number larger than 0.1. This width of the cross-section and the small length enable controlled effusion of an outside parylene monomer at 4.6 Pa and 273.14 K through the lumen to the inside of the core deposition chamber 200, which results in a reduced deposition rate of parylene compared to outside of the core deposition chamber 200.

In another illustration, diameter of a cylindrical lumen of the conduit 222 can be larger than 50 μm, for a Kn number smaller than 12. However, the diameter can be smaller than 50 μm if the deposition is onto a small components (e.g., less than a four inch wafer) or the deposition time is long, which results in an extremely thin layer of parylene in the order of tens of nm.

In an example, effusion can be the predominant transportation type, when the length is much larger than the cross-section (e.g., more than five times larger). The larger the ratio of length to cross-section, the larger the pressure decrease is from the outside to the inside of the deposition chamber 200, and the thinner the parylene deposition becomes.

In an illustration of a cylindrical lumen of the conduit 222, for parylene C, if the length to diameter ratio was around 7.79, the pressure can decrease to a half. If the ratio reaches 40, there may not be parylene monomer anymore. So, the length should be smaller than 40 times of the diameter (or, more generally, the cross-section) for C deposition. For parylene N, the length should be smaller than 90 times of the diameter (or, more generally, the cross-section). For parylene HT, the length should be less than 140 of the diameter (or, more generally, the cross-section).

Hence, for thin and ultra-thin parylene depositions, the lumen of the conduit 222 has a length and a cross-section, wherein the cross-section has a width between 50 μm and 6000 μm, and where the length is less than 140 times the cross-section width. The width and the length are selected to achieve either or both effusion and/or diffusion of monomeric gas, where the respective Kn number of the monomers is in the range between 0.1 and 12.

In an example, the thickness of the deposited parylene can be modeled based on the dimensions of the conduit 222. For this modeling, the relationship between deposition rate and deposition pressure are supposed to be the same in a machine chamber and in the deposition chamber 200 and can be expressed as:

$$R_{Direct} = R_D P_{MC} \quad (1)$$

$$R_{Inside} = R_D P_{DC} \quad (2),$$

where $R_D$ is a parameter related to temperature, sticking coefficient and molecular weight.

In the condition when the pressure in both the machine chamber and the deposition chamber 200 are stable, the flow rate of parylene monomer that passes through the conduit 222 can be expressed as:

$$Q = \tfrac{1}{4} v A (P_{MC} - P_{DC}) \quad (3),$$

where v is the thermal velocity of parylene monomers and A is the area of the lumen, according to the free molecular flow theory when Knudsen number is larger than 1.

All the Parylene monomers that enters the deposition chamber 200 are supposed to be deposited on the inner surface of the chamber 200, including the deposition component (e.g., a substrate or a MEMS device container in the deposition chamber 200), then the deposition rate and the flow rate of gas can be related as:

$$Q = K_B T \frac{dn}{dt} = \frac{K_B T S_{Chamber} R_{Inside}}{\delta}, \quad (4)$$

where $K_B$ is the Boltzman constant, T is the temperature, $S_{Chamber}$ is the inner surfacer area and $\delta$ transfers monomer numbers to thickness, which can be expressed as:

$$\delta = \frac{\tfrac{4}{3}\pi\left(\tfrac{x}{2}\right)^3}{\eta},$$

where x is the radius of the parylene monomer, $\eta$ is atomic packing factor, which equals to 74%, supposing the deposited parylene molecules are close packed.

By solving equation (1) to (4), the ratio of deposition rate between depositions outside and in the deposition chamber is derived as:

$$\frac{R_{Direct}}{R_{Inside}} = \frac{4 K_B T R_D S_{Chamber}}{\delta v A}.$$

For a square cross-section of the lumen, $A = d^2$, where d stands for the side length of the square, thus the ratio can be related to Knudsen number as:

$$\frac{R_{Direct}}{R_{Inside}} = \frac{4 K_B T R_D S_{Chamber}}{\delta v \lambda^2} K_n^2 = \frac{8\pi^2 R_D S_{Chamber} x^4 P_{MC}^2}{\delta v K_B T} K_n^2,$$

where $\lambda$ is the free molecule length of the Parylene monomer at $P_{MC}$.

Setting the temperature to be 293.14 K, the resulting parameters are listed in Table 1.

| $K_B$ | v | x | $\delta$ | $R_D$ |
|---|---|---|---|---|
| $1.38 \times 10^{-23}$ kgm$^2$s$^{-2}$K$^{-1}$ | 214.8 ms$^{-1}$ | $2.8 \times 10^{-10}$ m | $1.55 \times 10^{-29}$ m$^3$ | $2.35 \times 10^{-10}$ ms$^{-1}$Pa$^{-1}$ |

In an example, the deposition chamber 200 also includes a label 212. The label 212 stores information about the deposition chamber 200, such as one or more dimensions of the conduit 222, an identifier of the deposition chamber 200, an identifier of the base 210, and/or an identifier of the cover 220. The information can also relate to the deposition capability of the deposition chamber 200, such as pressure differential relative to a pressure inside the deposition chamber 200, a deposition rate, an expected thickness relative to a deposition time. Some or all of the deposition-related information can be derived from modeling, similar to the above, and/or measured in a laboratory environment and can be tabulated or plotted relative to deposition time or a pressure $P_{MC}$ in a machine chamber.

The label 212 can encode the information such that it is machine readable. For example, the label 212 is an RFID tag or a barcode. Additionally or alternatively, the information can be stored in a human-readable format, such that the label 212 is an alphanumeric and graphic print.

In an example, the label 212 is attached to the base 210. For instance, the label 212 is glued to an outer side of a wall of the base 210. In another example, the label is attached to the cover 220. For instance, the label 212 is glued to an outer side of the top of the cover 220 and does not block the conduit 222. In yet another example, each of the cover 220 and the base 210 includes a label 212.

FIGS. 3A and 3B illustrate cross section views of two configurations of a cover of a deposition chamber. In FIG. 3A, a deposition chamber 310 is integrally formed, where a cover and a base are a single part structure. As illustrated, the thickness of the base (e.g., its walls) and the cover can be uniform. In another example, the thickness is non-uniform. For instance, the thickness of the cover is tapered in toward an opening for a conduit through the cover. Generally, the thickness is large enough such that the structure integrity of the deposition chamber 310 is maintained across a range or pressures, such as between 0.3 Pa to 10 Pa. Of course, the thickness will depend on the type of material used for the deposition chamber 310 (e.g., paper, plastic, glass, ceramic, or metal) to maintain the structural integrity in the 0.3 Pa to 10 Pa range. In an example, the thickness is between 10 µm and 10 cm. For instance, the thickness of the cover around the opening can be down to 10 µm to support effusion through a cross-section of 50 µm.

In FIG. 3B, a deposition chamber is not integrally formed. Instead, it is formed with two separate parts: a base 350 and a cover 352. The cover 352 can be rigid and removable from the base 350. For instance, the cover 352 releasably mates with the base 350. The mating can include screw-top, twist-top, clamping, taping, or other means for securely attaching the cover 352 to the base 350 and for sealing the resulting deposition chamber. In an example, the cover 352 can also include a gasket for additional sealing. The thickness of the base 350 and the cover 352 can be similar to the thickness described in connection with FIG. 3A.

Figure 4C:
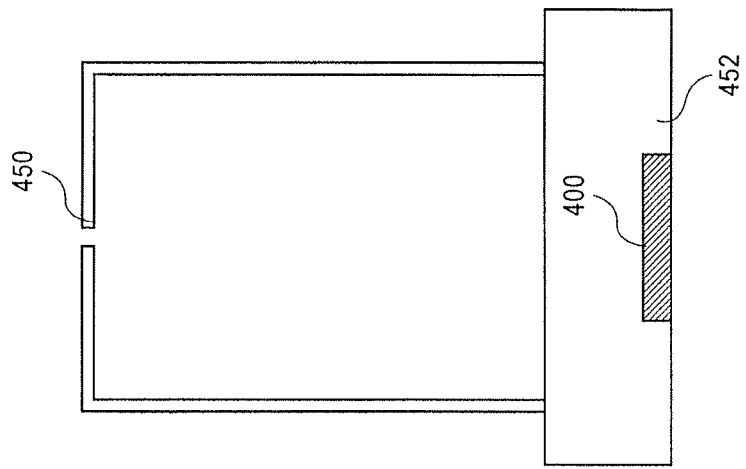
FIG. 4C illustrates a deposition chamber with non-integrally formed bottom surface and set of walls in accordance with an embodiment.
Figure 4B:
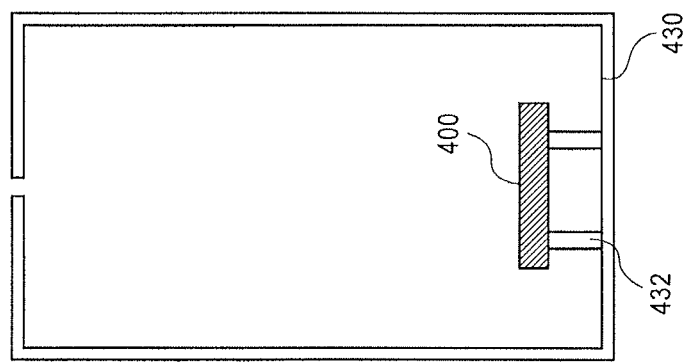
FIG. 4B illustrates another deposition chamber with integrally formed bottom surface and set of walls in accordance with an embodiment.
Figure 4A:
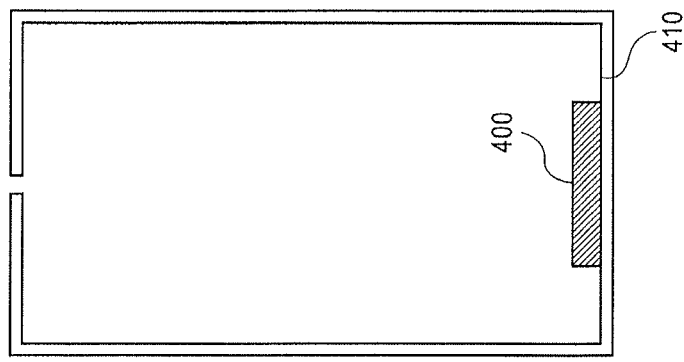
FIG. 4A illustrates a deposition chamber with integrally formed bottom surface and set of walls in accordance with an embodiment.

FIGS. 4A, 4B, and 4C are cross section views of three configurations of a bottom surface of a deposition chamber. Any of these configurations is usable with any of the two cover configurations described in connections with FIGS. 3A and 3B.

In FIG. 4A, a bottom surface and a set of walls of a deposition chamber 410 are integrally formed. The bottom surface includes no other structures. As such, an inner side of the bottom surface can receive and retain a component 400 that is subject to parylene deposition, such as a substrate, a MEMS device, or a wafer.

In FIG. 4B, a bottom surface and a set of walls of a deposition chamber 430 are integrally formed. However, the bottom surface includes a structure for retaining the component 400. FIG. 4B illustrates a structure that includes a set of posts 432. Other structures, such as a table, a T-shaped like platform, or a notch are possible.

In FIG. 4C, a bottom surface and a set of walls of a deposition chamber 450 are not integrally formed. Instead, the bottom surface and the set of walls are separate parts. In an example, the bottom surface is a tray 452. The tray 452 can be rigid and removable from a bottom of a base of the deposition chamber 450. For instance, the tray 452 releasably mates with the base. The mating can include screw-bottom, twist-bottom, clamping, taping, or other means for securely attaching the tray 452 to the base and for sealing the resulting deposition chamber 450. In an example, the tray 452 can also include a gasket for additional sealing. In an example, the tray 452 can receive and retain a component 400. In another example, the tray 452 can include a retaining structure, such as a set of posts, a table, a T-shaped like platform, or a notch. Generally, the tray 452 eases the placement and removal of the component in and from the deposition chamber 450.

FIGS. 5A, 5B, 5C, and 5D are cross section views of four configurations of conduit through a cover of a deposition chamber. Any of these configurations is usable with any of the two cover configurations described in connections with FIGS. 3A and 3B.

Figure 5A:
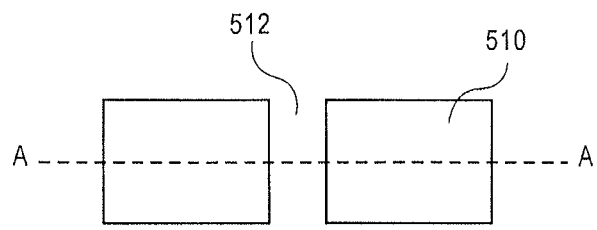
FIG. 5A illustrates a cover that includes an opening in accordance with an embodiment.

In FIG. 5A, a cover 510 includes an opening 512 that extends between the inner and outer sides of the cover 510. In this example configuration, the conduit corresponds to the opening 512. The opening 512 can be manufactured as part of the manufacturing of the cover 510. Otherwise, the opening 512 can be created post manufacturing via a drilling process (e.g., one that utilizes a high precision drilling tool).

Figure 5B:
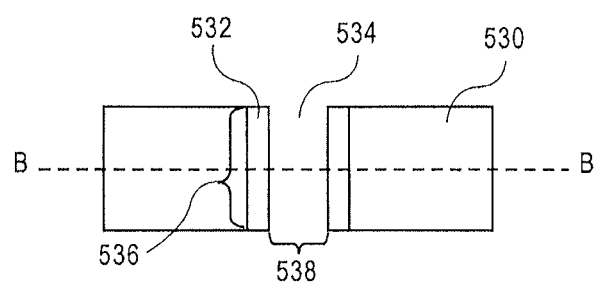
FIG. 5B illustrates a cover that includes a tube in accordance with an embodiment.

In FIG. 5B, a cover 530 also includes a tube 532 rather than merely an opening as in FIG. 5A. The tube 532 extends between and stops at the inner and outer sides of the cover 530. In this example configuration, the tube 532 attaches to the sides of the wall(s) defined by the opening in the cover 530. The conduit corresponds to the tube 532.

In an example, the tube 532 can be made of paper, plastic, rubber (e.g., silicone), glass, ceramic, metal, or other material, and can be rigid, pliable, or elastic. The tube 532 can be manufactured as part of the manufacturing of the cover 530. Otherwise, the tube 532 can be created post manufacturing by securely attaching and sealing the tube 532 to the sides of the wall(s) defined by the opening.

Generally, the tube 532 has a lumen 534 that has a length 536 and a cross-section 538. In this case, the length 536 corresponds to the height (or thickness) of the cover 530 around the opening. The cross-section corresponds to the distance between opposite points on the wall(s) of the tube 532.

Figure 5C:
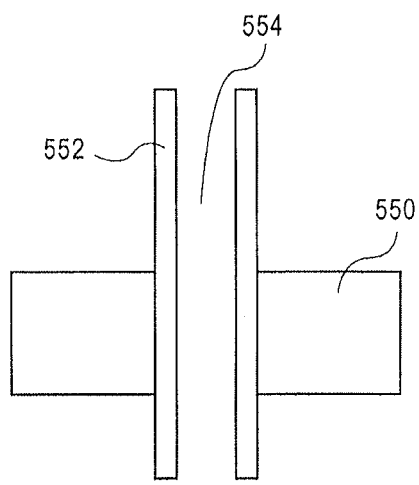
FIG. 5C illustrates another cover that includes a tube in accordance with an embodiment.

In FIG. 5C, a cover 550 also includes a tube 552. In this example configuration, the tube 552 extends upward away from the top of the cover 550 and downward away from the bottom of the cover 550. The conduit corresponds to the tube 552. As such, the lumen 554 of this tube 552 has a length greater than the height (or thickness) of the cover 550. The lumen 554 extends upward and downward from the cover 550.

Figure 5D:
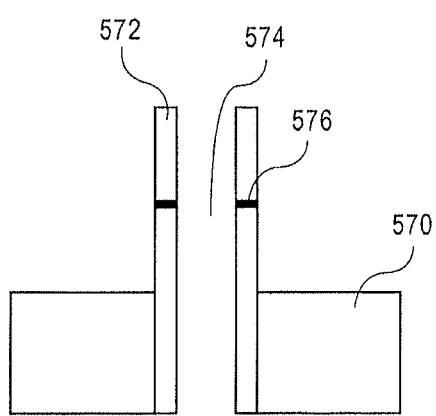
FIG. 5D illustrates another cover that includes a tube in accordance with an embodiment.

In FIG. 5D, a cover 570 also includes a tube 572. In this example configuration, the tube extends only upward away from the top of the cover 570. The conduit corresponds to the tube 572. As such, the lumen 574 of this tube 572 has a length greater than the height (or thickness) of the cover 570. The lumen 572 extends upward from the cover 570.

In both example configurations of FIGS. 5C and 5D, the respective conduit includes at least one notch along a secant of the conduit (shown in FIG. 5D as notch 576) at a predetermined axial position of the conduit. The notch(es) enables a user to more easily cut or sever the conduit to a new, predetermined length. Hence, one or more notches may exist along the conduit. Each of the notches can be located at a predetermined location and corresponds to a potential length of the conduit. By cutting the conduit at a particular notch, the user sets the conduit to a desired length, where this length results in a particular rate of effusion and/or diffusion. The notches and the resulting deposition rate and/or length can be identified on a label of the deposition chamber.

Figure 5H:
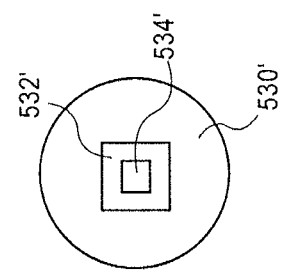
FIG. 5H illustrates a cross-section of a cover that includes another tube in accordance with an embodiment.
Figure 5G:
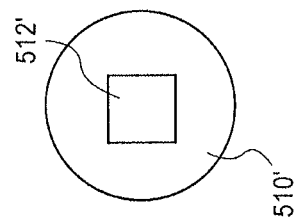
FIG. 5G illustrates a cross-section of a cover that includes another opening in accordance with an embodiment.
Figure 5F:
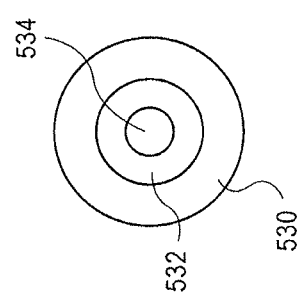
FIG. 5F illustrates a cross-section of a cover that includes a tube in accordance with an embodiment.
Figure 5E:
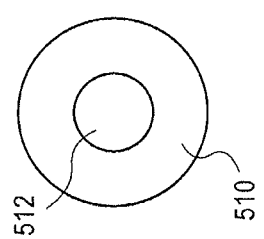
FIG. 5E illustrates a cross-section of a cover that includes an opening in accordance with an embodiment.

FIG. 5E illustrates a cross-section of the cover 510 along the A-A line in FIG. 5A. As illustrated, the cover 510 includes a cylindrical opening 512. The opening 512 has a circular surface are defined by a diameter.

FIG. 5F illustrates a cross-section of the cover 530 along the B-B line in FIG. 5B. As illustrated, the cover 530 includes a cylindrical tube 532. The lumen 534 of the tube 532 is circular and has a diameter.

FIG. 5G illustrates another cross-section of the cover 510 along the A-A line in FIG. 5A. As illustrated, the cover 510 (shown as cover 510') includes a cuboid opening 512'. The opening 512' has a square surface are defined by a width.

FIG. 5H illustrates a cross-section of the cover 530 along the B-B line in FIG. 5B. As illustrated, the cover 530 (shown as cover 530') includes a cuboid tube 532'. The lumen 534' of the tube 532' has a square surface area defined by a width.

Although FIGS. 5E, 5F, 5G, and 5H illustrate cylindrical and cuboid shapes, other shaped are possible. For instance, cubic, hexagon, cone, pyramid, and other polygonal shapes or irregular shapes are possible for the opening 512, the tube 532, and/or the lumen 534.

Figure 6:
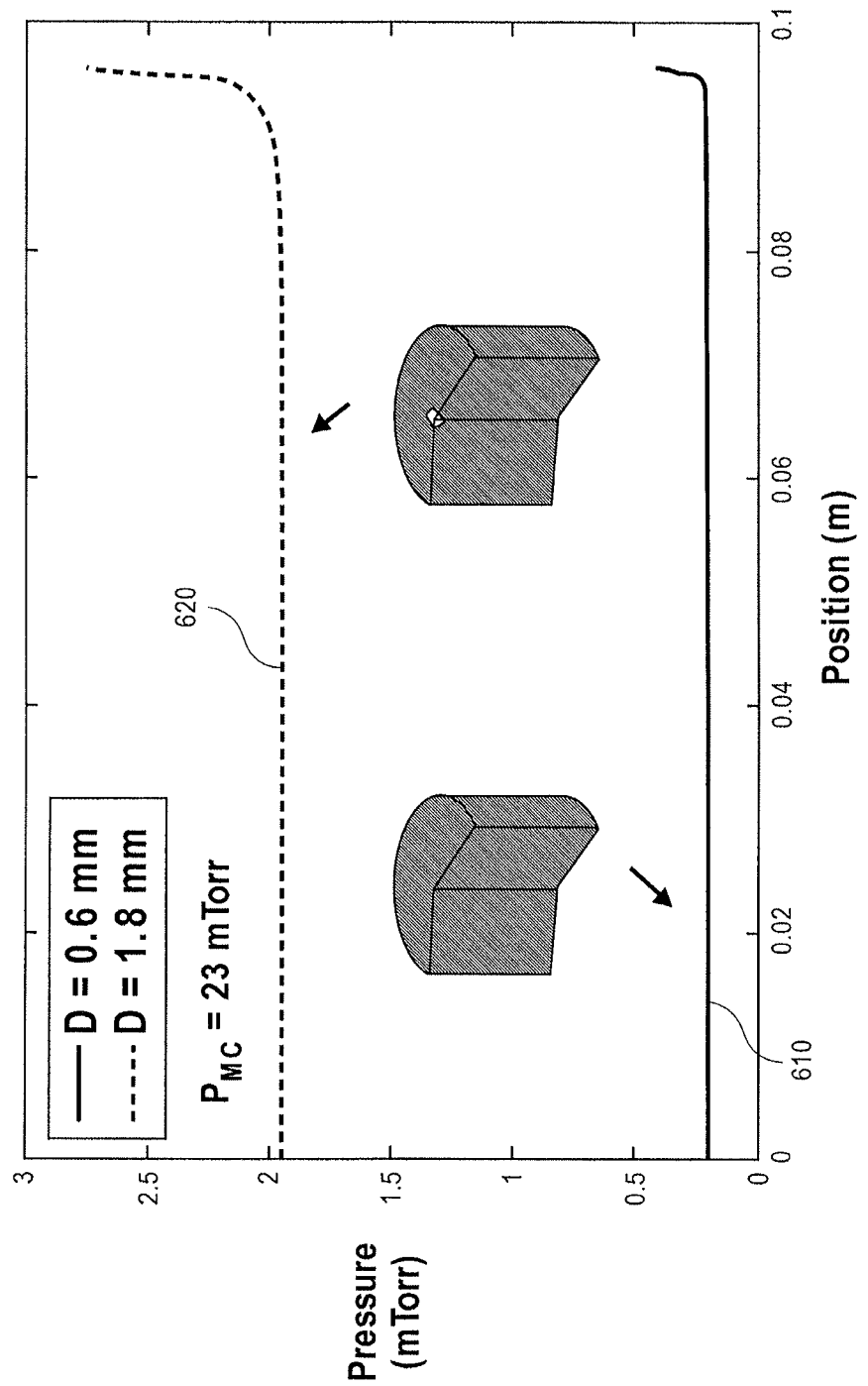
FIG. 6 illustrates a numerical simulation of the distribution of active monomers inside a deposition chamber in accordance with an embodiment.

FIG. 6 illustrates a numerical simulation of the distribution of active monomers inside a deposition chamber. The horizontal axis refers to the distance from the inner side of the bottom surface of the deposition chamber. The vertical axis refers to the pressure $P_{DC}$ (in mTorr) inside the deposition chamber. The solid line 610 corresponds to a cylindrical conduit with a 0.6 mm diameter. The dotted line 620 corresponds to a cylindrical condition with a 1.8 mm. The pressure $P_{MC}$ inside the machine chamber is 23 mTorr (about 3 Pa). As illustrates, both pressures $P_{DC}$ are constant across the different distances within the deposition chamber, indicating that the deposition of parylene can be uniform. Importantly also, the pressures $P_{DC}$ are much lower than the pressure $P_{MC}$. Specifically, the pressure $P_{DC}$ 610 of the 0.6 mm conduit is about 0.2 mTorr (about 0.027 Pa) or about 115 times smaller than $P_{MC}$. Thus, if a 1 µm thick parylene film can be controllably manufactured in the machine chamber, a 115 times thinner parylene film (e.g., about 9 nm) can be likewise controllably manufactured in the deposition chamber. Similarly, the pressure $P_{DC}$ 620 of the 1.8 mm conduit is about 1.95 mTorr (about 0.26 Pa) or about 88.5 times smaller than $P_{MC}$. Thus, if a 1 µm thick parylene film can be controllably manufactured in the machine chamber, an 88.5 times thinner parylene film (e.g., about 112 nm) can be likewise controllably manufactured in the deposition chamber.

Figure 7:
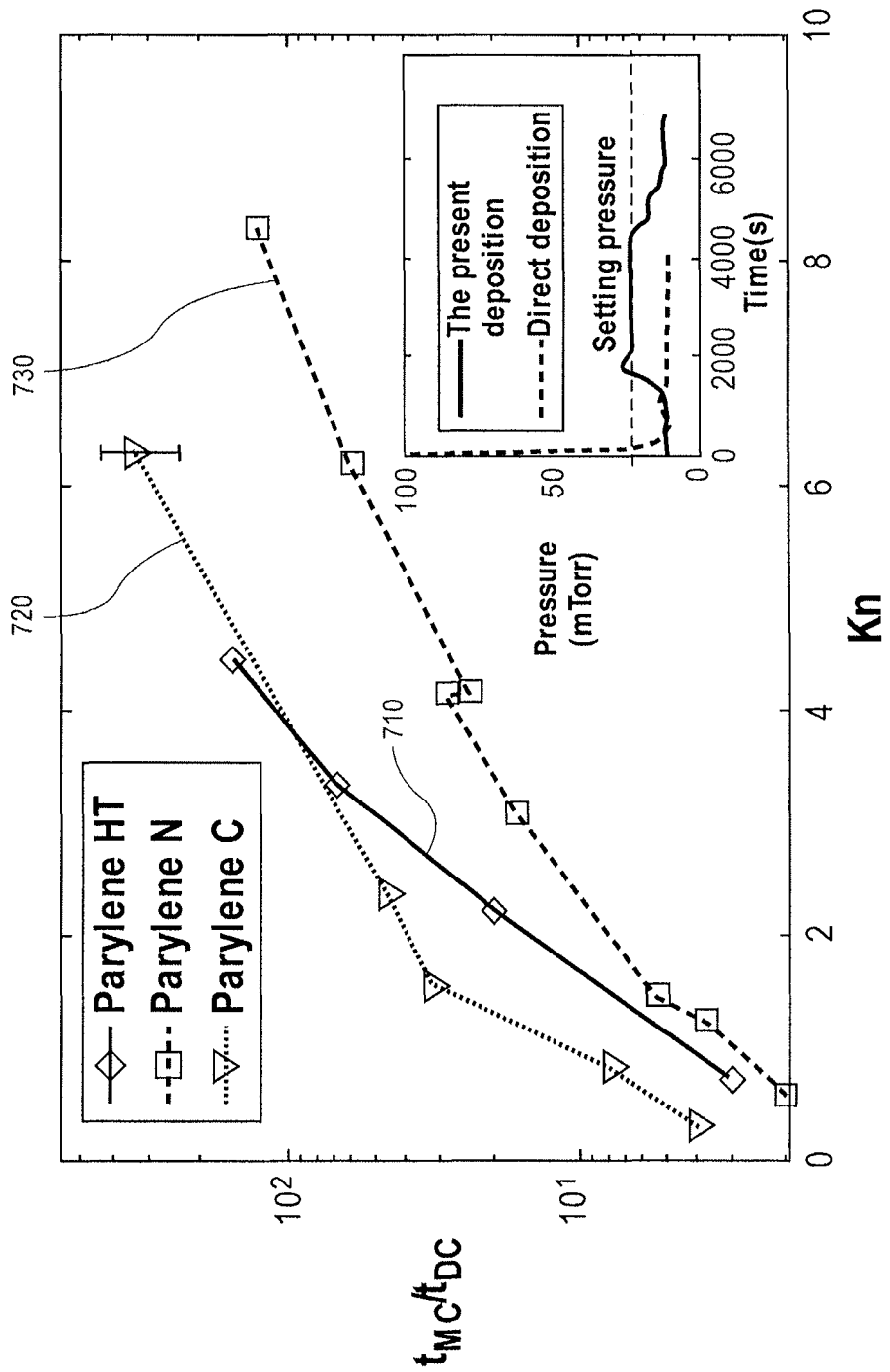
FIG. 7 illustrates experimental results of thicknesses of different types of parylene deposition in accordance with an embodiment.

FIG. 7 illustrates experimental results of thicknesses of different types of parylene deposition. Dimes for parylene N, C, and HT are used. The horizontal axis refers to the Knudsen number (Kn). The vertical axis refers to the ratio of the achieved thickness in the machine chamber $t_{MC}$ to the achieved thickness in the deposition chamber $t_{DC}$. The ration 710 is for parylene N. The ratio 720 is for parylene C. And the ratio 730 is for parylene HT. The experimental results show that at a Kn of about four, a 100 times thinner parylene N and C are achieved. At a Kn of about eight, a 100 times thinner parylene HT is achieved.

Figure 8:
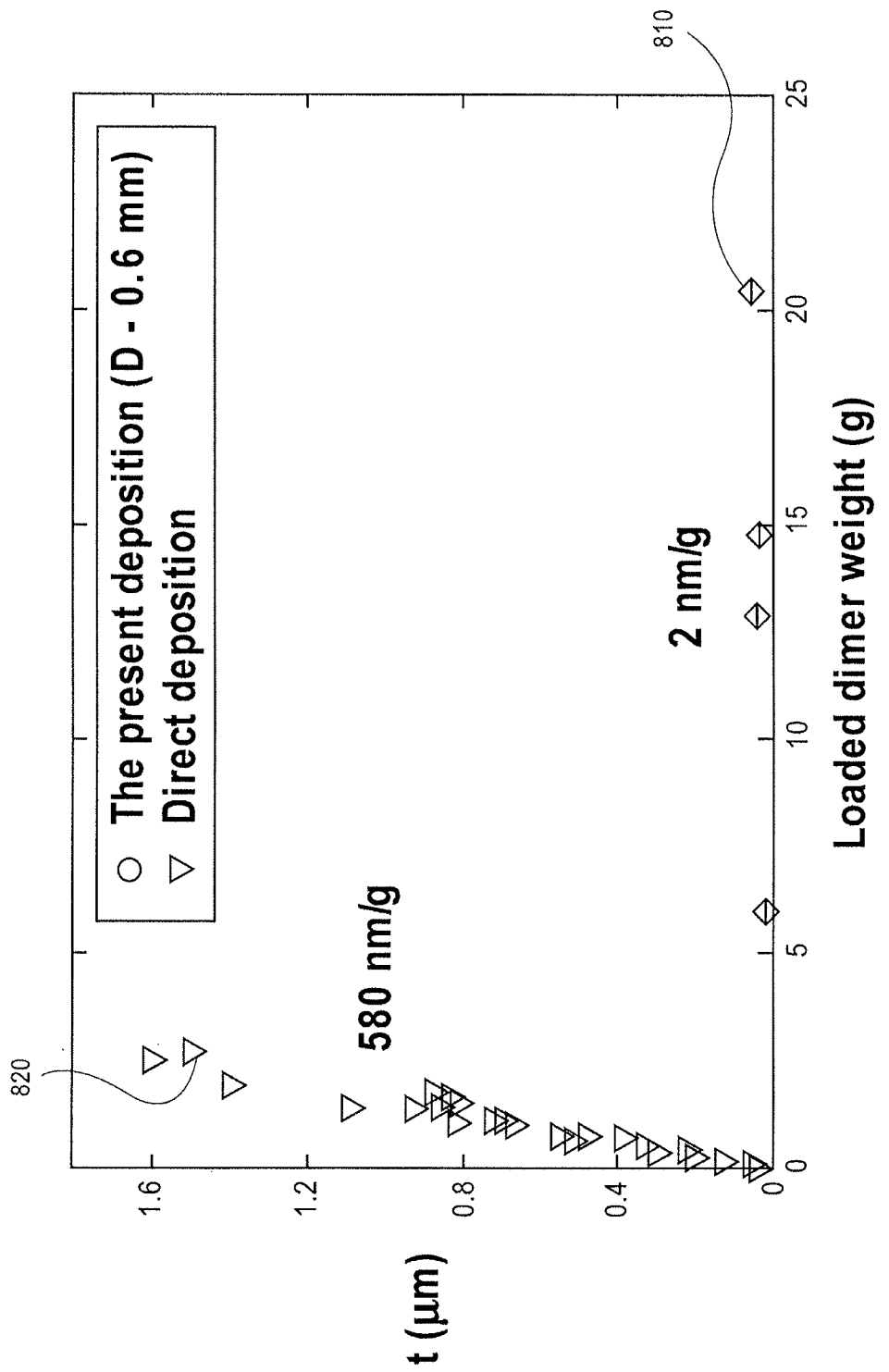
FIG. 8 illustrates experimental results of deposited thicknesses relative to a loaded dimer weight in accordance with an embodiment.

FIG. 8 illustrates experimental results of deposited thicknesses relative to a loaded dimer weight. The horizontal axis refers to the loaded dimer weight. The vertical axis refers to the thickness of the deposited parylene in micrometer. The thickness 810 corresponds to deposition in a deposition chamber that has a cylindrical conduit with a 0.6 mm diameter. The thickness 820 refers to a deposition in a machine chamber. As shown, the thickness 810 is relatively constant or uniform at 20 nm. In comparison, the thickness 820 is linear with a high slope. To achieve 20 nm thickness, a very small amount of dimers is needed (in the milligram range). If more than 2 grams are used, the thickness 820 is over 1 μm. These experimental results prove that, with flash deposition, the deposition thickness is highly uncontrollable and is highly sensitive to the amount of the loaded dimer. In contrast, by using the deposition chamber, the deposition thickness is highly controllable and repeatable even in the nanometer range.

Figure 9:
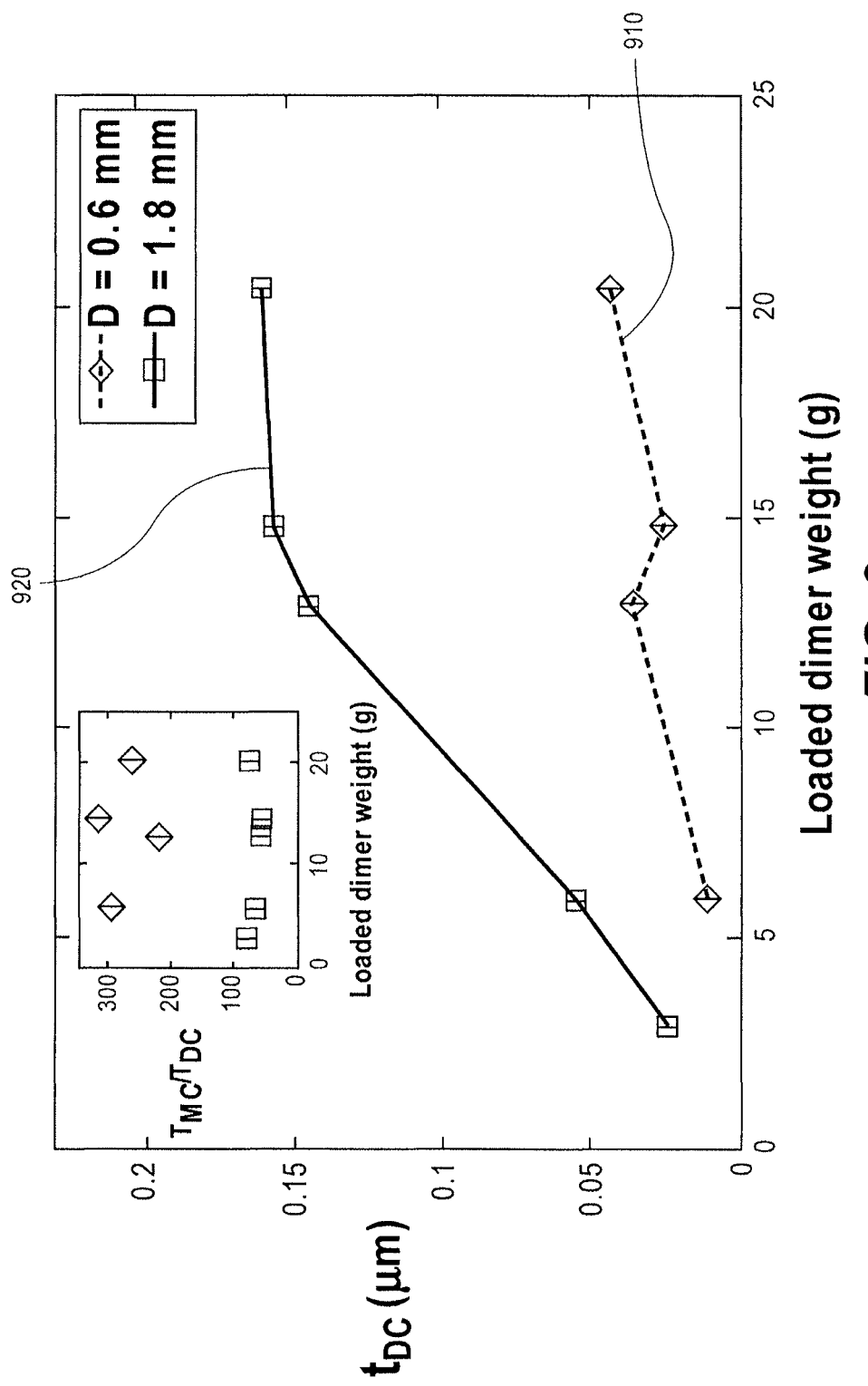
FIG. 9 illustrates experimental results of deposited thicknesses relative to a diameter of a cylindrical conduit in accordance with an embodiment.

FIG. 9 illustrates experimental results of deposited thicknesses relative to a diameter of a cylindrical conduit. The horizontal axis refers to the loaded dimer weight. The vertical axis refers to the thickness of the deposited parylene in micrometer. The thickness 910 corresponds to deposition in a deposition chamber that has a cylindrical conduit with a 0.6 mm diameter. The thickness 920 corresponds to deposition in a deposition chamber that has a cylindrical conduit with a 1.8 mm diameter. The thickness 910 varies between 10 nm and 30 nm depending on the amount of the dimer. The thickness 920 varies between 20 nm and 150 nm depending on the amount of dimer. By using 5 grams of the dimer and the 0.6 mm conduit, a 10 nm parylene deposition is achieved. On the other hand, by using 20 grams of the dimer and the 1.8 mm conduit, a 150 nm parylene deposition is achieved. These experimental results prove that manufacturing thin and ultra-thin parylene films is controllable and repeatable in respective deposition chambers.

Figure 10:
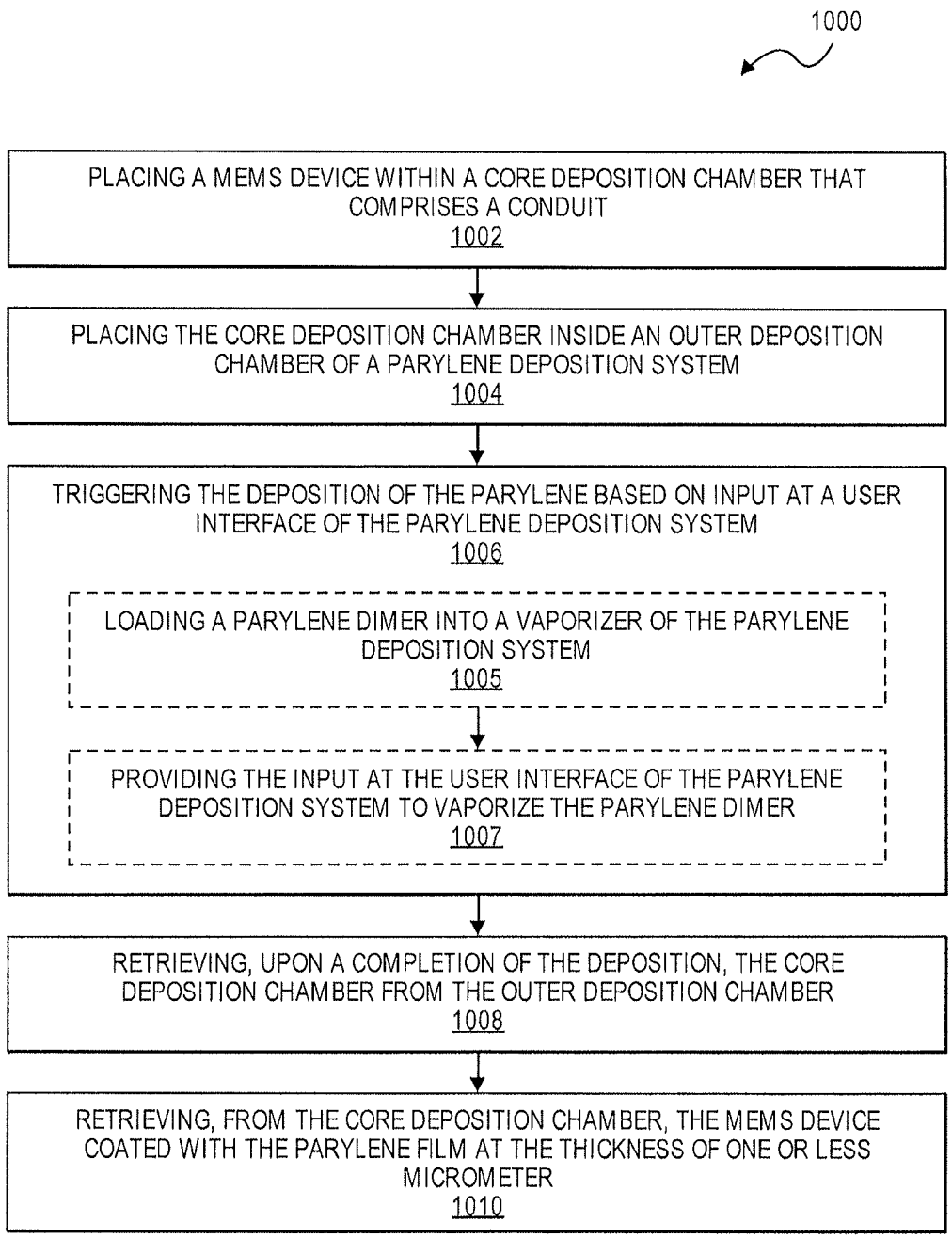
FIG. 10 illustrates an example method of operating a parylene deposition system to deposit thin or ultra-thin parylene in accordance with an embodiment.

FIG. 10 illustrates an example method 1000 of operating a parylene deposition system to deposit thin or ultra-thin parylene in accordance with an embodiment. The example method 1000 is illustrated with depositing parylene onto a surface of a MEMS device. The method 1000 can be similarly applied to deposit parylene on other components, such as on a substrate.

At operation 1002, an operator places the MEMS device within a core deposition chamber that comprises a conduit. Any of the deposition chambers and conduits described herein above can be used.

At operation 1004, the operator places the core deposition chamber inside an outer deposition chamber (or, equivalently, machine chamber) of a parylene deposition chamber. For example, the core deposition chamber is placed on a rotating platform located in the interior of the machine chamber.

At operation 1006, the operator triggers the deposition of the parylene onto a surface of the MEMS device based on input at a user interface of the parylene deposition chamber. This operation can include a number of sub-operations. At sub-operation 1005, the operator loads an amount of parylene dimer and/or the parylene deposition system loads that amount into its vaporizer. The amount can have a weight in the gram range. At sub-operation 1007, the operator provides inputs that sets control parameters for the deposition. Different types of inputs are possible. Generally, the type of the input depends on a label attached to the deposition chamber and capabilities of the parylene deposition machine (e.g., the functionality of the user interface, the availability of a label reader). In one example, the input specifies the deposition time and the pressure $P_{MC}$. In this case, the operator derives these parameters from the label of the deposition chamber to achieve a desired thickness. In another example, the label is read by the label reader, or an identifier of the deposition chamber and/or a dimension(s) of the conduit are inputted at the user interface. This enables the parylene deposition system to set control parameters to deposit the parylene and achieved a particular thickness. Hence, the input of the operator thereafter needs to merely specify the desired thickness.

At operation 1008, the operator retrieves, upon completion of the deposition, the core deposition chamber from the outer deposition chamber (e.g., the machine chamber). For example, once the deposition time elapses, the operator opens a door or a hatch of the machine chamber and removes the core deposition chamber. If other MEMS devices were also placed inside the machine chamber (but not in any deposition chamber), the operator can retrieve them. These MEMS devices would have a parylene coating that is thicker than 1 μm.

At operation 1010, the operator retrieves, from the core deposition chamber, the MEMS device coated with the parylene film. The thickness of this coating is less than 1 μm and can be in the nanometer range depending on the dimensions of the conduit, the deposition chamber, the pressure $P_{MC}$, and the deposition time, among other factors.

Figure 11:
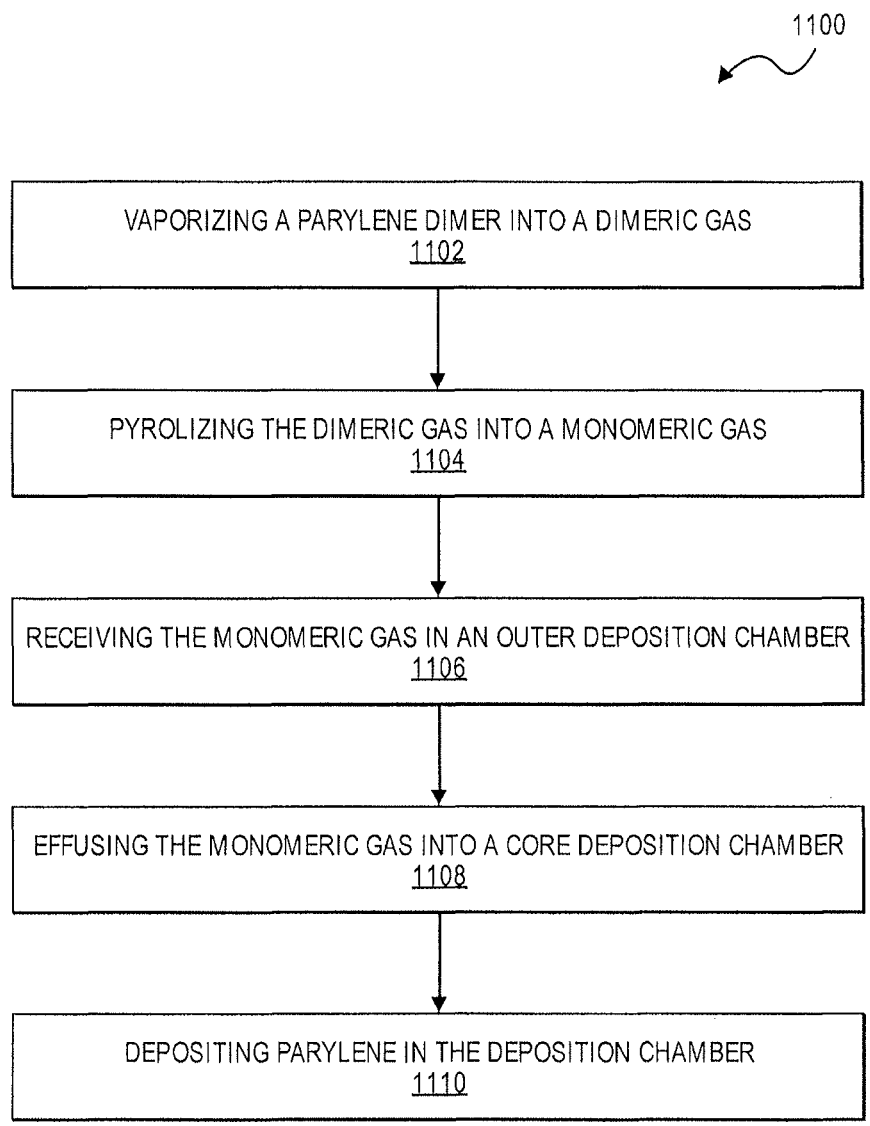
FIG. 11 illustrates an example method of depositing thin or ultra-thin parylene in accordance with an embodiment.

FIG. 11 illustrates an example method 1100 of depositing thin or ultra-thin parylene in accordance with an embodiment. This example method 1100 is recited from the perspective of a parylene deposition system that includes a vaporizer, a pyrolysis tube, an outer deposition chamber (e.g., a machine chamber), such as the vapor deposition polymerization system 100 of FIGS. 1A and 1B. A core deposition chamber can be placed in and removed from the machine chamber to enable thin and ultra-thin parylene deposition. Here also, the example method 1100 is illustrated with depositing parylene onto a surface of a MEMS device. The method 1100 can be similarly applied to deposit parylene on other components, such as on a substrate.

At operation 1102, the parylene deposition system vaporizes a parylene dimer into a dimeric gas. For example, the machine chamber contains the deposition chamber that, in turn, contains the MEMS device. An amount of parylene dimer is loaded into the parylene deposition system. This amount is in the gram range and is sufficient for a typical deposition of thick parylene (e.g., thicker than 1 μm) in the machine chamber. The vaporizer vaporizes the parylene dimer into the dimeric gas.

At operation 1104, the parylene deposition system pyrolizes the dimeric gas into a monomeric gas. For example, the pyrolysis tube receives the dimeric gas from the vaporizer and pyrolizes the received gas into the monomeric gas.

At operation 1106, the machine chamber receives the monomeric gas. For example, the interior of the machine chamber is pressurized at a particular pressure $P_{MC}$ (e.g., at about 3 Pa) and is maintained a certain temperature (e.g., at about room temperature of 25° C.). The monomeric gas is received in the interior from the pyrolysis tube. Deposition of parylene onto surface of MEMS devices located on a rotating platform (but outside any deposition chamber) is possible at that pressure $P_{MC}$ and temperature. However, this deposition results in thick parylene (e.g., thicker than 1 μm).

At operation 1108, the monomeric gas effuses into the core deposition chamber. For example, a portion of the monomeric gas present in the machine chamber effuses via a conduit through a top of a cover of the core deposition chamber into an interior of the core deposition chamber. The effusion depends on dimensions (e.g., length and cross-section) of the conduit, among other factors. Although this operation illustrates effusion, a portion of the monomeric gas can additionally or alternatively diffuse into the core deposition chamber dependently of the dimensions of the conduit.

At operation 1110, parylene is deposited onto the surface of the MEMS device contained in the deposition chamber. The pressure $P_{DC}$ inside the deposition chamber is much smaller than the pressure $P_{MC}$ inside the machine chamber, whereas the temperature can be the same. Hence, parylene deposition occurs from the effused (and/or diffused) monomeric gas at a the lower pressure $P_{DC}$, resulting in thin (e.g., less than 1 thick parylene) or ultra-thin (e.g., in the nanometer thickness range) parylene film that coats the surface of the MEMS device.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. "About" in reference to a temperature or other engineering units includes measurements or settings that are within ±1%, ±2%, ±5%, ±10%, or other tolerances of the specified engineering units as known in the art.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A parylene deposition metering apparatus comprising:
a base;
a removable cover configured to mate and seal with the base to create an enclosed, core deposition chamber and define an inside and an outside of the core deposition chamber, the base and the cover configured to withstand an internal vacuum pressure relative to the outside of at least 3.0 Pa; and
a conduit through a top of the cover and about a center of the top of the cover, the conduit defined at least in part by a first fixed portion of the cover and a second fixed portion of the cover, the first fixed portion spaced apart from the second fixed portion by a distance between 50 μm and 6000 μm, the conduit having a lumen connecting the inside to the outside of the core deposition chamber, the lumen having a length and a cross-section, the cross-section having a width equal or smaller to the distance between the first fixed portion and the second fixed portion of the cover, the length being less than 140 times the cross-section width.

2. The parylene deposition metering apparatus of claim 1, wherein the lumen comprises an unobstructed path between the inside and outside of the core deposition chamber, wherein the unobstructed path is along an axis that is perpendicular to a deposition surface that is in the inside of the core deposition chamber and that is configured to receive a substrate for parylene deposition, and wherein the cross-section is circular and the cross-section width is a diameter,
whereby the cross-section diameter and length are configured to enable controlled effusion of an outside parylene monomer at 4.6 Pa and 273.14 K through the lumen to the inside of the core deposition chamber based on the unobstructed path, the effusion resulting in a reduced deposition rate compared to outside of the core deposition chamber.

3. The parylene deposition metering apparatus of claim 1, further comprising:
a plurality of notches along a secant of the conduit at a predetermined axial position of the conduit, each of the plurality of notches corresponding to a different rate of effusion or diffusion and located along the secant based on the rate, thereby enabling a user to more easily cut or sever the conduit to a new, predetermined length.

4. The parylene deposition metering apparatus of claim 1, wherein the length is less than 40 times the cross-section width for parylene C deposition.

5. The parylene deposition metering apparatus of claim 1, wherein the cross-section width is greater than 76 µm, and wherein the length is greater than 7 times the cross-section width.

6. The parylene deposition metering apparatus of claim 1, wherein the core deposition chamber has a volume between 1 cubic centimeter and 10,000 cubic centimeters.

7. The parylene deposition metering apparatus of claim 1, further comprising a tube that defines the conduit through the top of the cover and that extends through the cover to the outside and inside.

8. The parylene deposition metering apparatus of claim 1, wherein the cross section of the conduit corresponds to a Knudsen number (Kn) of a monomer between 0.1 and 12.

9. The parylene deposition metering apparatus of claim 1, wherein the base comprises a rigid, removable tray that is opposite to the cover and that is configured to mate and seal with the base and to retain a substrate inside the core deposition chamber.

10. The parylene deposition metering apparatus of claim 9, wherein a distance between an inner side of the cover and an inner side of the tray is between 1 centimeter and 40 centimeters.

11. The parylene deposition metering apparatus of claim 1, wherein the conduit is a first conduit, wherein the cover comprises a plurality of additional conduits, and wherein each additional conduit has substantially a same length and cross-section as the first conduit.

12. The parylene deposition metering apparatus of claim 1, wherein the cover is disposable after a first predefined number of parylene deposition, wherein the base is disposable after a second predefined number of parylene deposition, and wherein the second predefined number is larger than the first predefined number.

13. The parylene deposition metering apparatus of claim 1, further comprising a label that identifies at least one of a dimension of the conduit, a pressure differential relative to a pressure inside the core deposition chamber, or an identifier of the core deposition chamber.

14. The parylene deposition metering apparatus of claim 13, wherein the label comprises a radio frequency identifier-identification (RFID) tag that encodes the at least one of: the dimension, the pressure differential, or the identifier.

15. The parylene deposition metering apparatus of claim 13, wherein the label comprises a barcode that encodes the at least one of: the dimension, the pressure differential, or the identifier.

16. The parylene deposition metering apparatus of claim 1, wherein the length is greater than fifteen times the cross-section width.

17. The parylene deposition metering apparatus of claim 1, wherein each of the distance and the cross-section width is greater than 400 µm, and wherein the length is greater than two times the cross-section width.

18. A parylene deposition system comprising:
a vaporizer configured to vaporize a polymer dimer into a dimeric gas;
a pyrolysis tube connected to the vaporizer and configured to pyrolize the dimeric gas into a monomeric gas;
an outer deposition chamber connected to the pyrolysis tube and having an interior configured to receive the monomeric gas; and
a core deposition chamber placeable in and removable from the outer deposition chamber and configured to effuse the monomeric gas from interior of the outer deposition chamber into an interior of the core deposition chamber, the core deposition chamber comprising:
a base,
a removable cover configured to mate and seal with the base and define the interior of the core deposition chamber, and
a conduit through a top of the cover and about a center of the top of the cover, the conduit defined at least in part by a first fixed portion of the cover and a second fixed portion of the cover, the first fixed portion spaced apart from the second fixed portion by a distance between 50 µm and 6000 µm, the conduit having a lumen connecting the interior of the core deposition chamber to the interior of the outer deposition chamber, the lumen having a length and a cross-section, the cross-section having a width equal or smaller to the distance between the first fixed portion and the second fixed portion of the cover, the length being less than 140 times the cross-section width.

19. The parylene deposition system of claim 18, further comprising a label reader, wherein the core deposition chamber comprises a label that identifies at least one of: a dimension of the conduit, a pressure differential relative to a pressure inside the core deposition chamber, or an identifier of the core deposition chamber.

20. The parylene deposition system of claim 19, wherein the system is configured to set a deposition time and a pressure inside the outer deposition chamber based on a read of the label by the label reader.

\* \* \* \* \*